United States Patent
Song et al.

(10) Patent No.: US 12,184,059 B2
(45) Date of Patent: Dec. 31, 2024

(54) FAULT PROTECTION TESTING IN A HIGH-POWER SWITCHING SYSTEM

(71) Applicant: SEMICONDUCTOR COMPONENTS INDUSTRIES, LLC, Phoenix, AZ (US)

(72) Inventors: Kinam Song, Gilbert, AZ (US); Yi-Feng Hsia, Chandler, AZ (US); Vlad Anghel, Bucharest (RO)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 282 days.

(21) Appl. No.: 17/806,817

(22) Filed: Jun. 14, 2022

(65) Prior Publication Data
US 2022/0407308 A1    Dec. 22, 2022

Related U.S. Application Data

(60) Provisional application No. 63/212,222, filed on Jun. 18, 2021.

(51) Int. Cl.
*H02H 7/00* (2006.01)
*H02H 1/00* (2006.01)
*H02H 7/20* (2006.01)

(52) U.S. Cl.
CPC ............ *H02H 7/20* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 6,859,087 B2 * | 2/2005 | Galli | H02M 3/3376 327/423 |
| 9,627,878 B2 | 4/2017 | Habu et al. | |
| 11,519,954 B2 * | 12/2022 | Gunasekaran | G01R 31/3277 |
| 11,962,291 B2 * | 4/2024 | Oberdieck | H03K 17/0822 |
| 2016/0025800 A1 | 1/2016 | Sicard | |
| 2016/0282407 A1 | 9/2016 | Bacigalupo et al. | |
| 2017/0122996 A1 | 5/2017 | Sullivan | |

OTHER PUBLICATIONS

European Patent Office, "European Search Report," Application No. 22179554.5-1211, Nov. 2, 2022.
STMicroelectronics NV, "Autmotive Galvanically Isolated Advanced Single Gate Driver," STGAP1AS, Datasheet—production data, Mar. 2018.

* cited by examiner

Primary Examiner — Stephen W Jackson
(74) Attorney, Agent, or Firm — Brake Hughes Bellermann LLP

(57) ABSTRACT

A power system including a gate driver configured with test circuitry to detect faults is disclosed. The power system may be configured to test the fault detection circuitry in order to confirm its ability to detect faults. Various methods and circuit implementations are disclosed to determine the ability of the system to detect faults. The testing may include different configurations and protocols in order to make conclusions about which components are likely responsible for a failure. These components may include components included in the gate driver or externally coupled to the gate driver. The disclose approach does not significantly add complexity because a test input to initiate a test may be communicated from a low voltage side to a high voltage side over a shared communication channel.

19 Claims, 13 Drawing Sheets

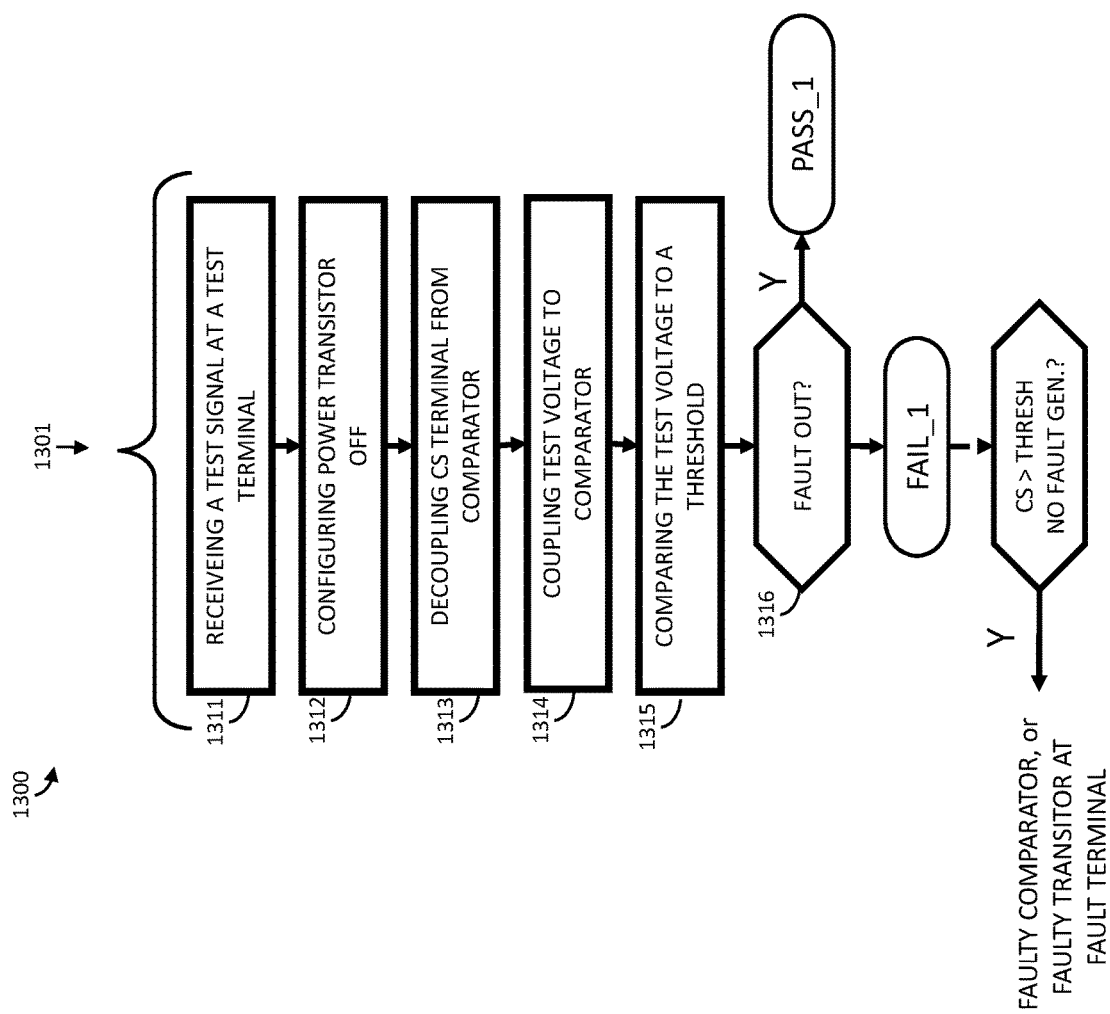

FAULT PROTECTION TESTING IN A HIGH-POWER SWITCHING SYSTEM

CROSS-REFERENCE TO RELATED APPLICATION

This application claims the benefit of U.S. Provisional Application No. 63/212,222, filed on Jun. 18, 2021, which is hereby incorporated by reference in its entirety.

FIELD OF THE DISCLOSURE

The present disclosure relates to power transistors and more specifically to a gate driver having fault protection circuitry.

BACKGROUND

A gate driver is an integrated circuit configured to convert a low voltage (LV) switching signal into a high voltage (HV) signal suitable for driving a power transistor ON/OFF. Some systems (e.g., automotive systems) require the power transistor to be monitored in order to protect against faults, such as a short circuit, that could lead to damage.

SUMMARY

In some aspects, the techniques described herein relate to a power system including: a power transistor that is configurable in an ON condition or an OFF condition corresponding to a signal at a gate of the power transistor; a desaturation sense circuit coupled to a terminal of the power transistor; the desaturation sense circuit including a blanking capacitor configured to be charged to a voltage corresponding to a desaturation condition of the power transistor; a gate driver including: a driver circuit configured to generate the signal at the gate of the power transistor according to an input signal at an input terminal of the gate driver; and a desaturation fault detection circuit that is configured receive the voltage of the blanking capacitor and generate a fault signal when the voltage of the blanking capacitor exceeds a threshold; and a control module configured to perform a test of the power system, the test including: transmitting a test signal to a test terminal of the gate driver to configure the power transistor in the OFF condition and to configure the desaturation fault detection circuit to receive the voltage of the blanking capacitor, the voltage of the blanking capacitor charged by the desaturation fault detection circuit during the test.

In some aspects, the techniques described herein relate to a power system, wherein the test further includes: not receiving the fault signal in response to the test signal; failing the test; and determining from the test that failed: the desaturation fault detection circuit did not generate the fault signal; the blanking capacitor was not charged; or the power transistor was short circuited.

In some aspects, the techniques described herein relate to a power system, wherein the test further includes: receiving the fault signal in response to the test signal; passing the test; and determining from the test that passed: the desaturation fault detection circuit and the blanking capacitor are operating properly to detect the desaturation condition of the power transistor; and the power transistor is not short circuited.

In some aspects, the techniques described herein relate to a power system, wherein the test is a first test, the test signal is a first test signal, and the fault signal is a first fault signal; the control module is further configured to: performing a second test of the power system after the first test is passed, the second test including: transmitting a second test signal to the input terminal of the gate driver to configure the power transistor in the ON condition and to configure the desaturation fault detection circuit to receive the voltage of the blanking capacitor, the voltage of the blanking capacitor charged by the power transistor in the ON condition.

In some aspects, the techniques described herein relate to a power system, wherein the gate driver further includes: an isolation barrier between a low-voltage side and a high-voltage side, and a multiplexer configured to communicate the second test signal at the input terminal of the gate driver and the first test signal at the test terminal of the gate driver across the isolation barrier over a shared communication channel.

In some aspects, the techniques described herein relate to a power system, wherein the second test further includes: receiving the fault signal in response to the second test signal; failing the second test; and determining from the second test that failed: the gate of the power transistor did not receive the signal from the driver circuit to configure the power transistor in the ON condition; the blanking capacitor was not charged by the power transistor in the ON condition; or the power transistor was open circuited.

In some aspects, the techniques described herein relate to a power system, wherein the second test further includes: receiving no fault signal in response to the second test signal; passing the second test; and determining from the second test that passed: the driver circuit is operating properly to transmit the signal to the gate of the power transistor to configure the power transistor in the ON condition; the desaturation sense circuit is operating properly to charge the power transistor according to a desaturation voltage at the terminal of the power transistor; and the power transistor is not open circuited.

In some aspects, the techniques described herein relate to a power system, wherein the power transistor is an insulated gate bipolar transistor (IGBT) coupled at the gate to the driver circuit, coupled at a collector to the desaturation sense circuit, and coupled at an emitter to a ground.

In some aspects, the techniques described herein relate to a power system, wherein the desaturation sense circuit includes: a resistor coupled to a desaturation terminal of the gate driver; and a diode coupled between the resistor and the collector of the insulated gate bipolar transistor, wherein an anode of the diode is coupled to the resistor and a cathode of the diode is coupled to the collector of the insulated gate bipolar transistor, wherein the blanking capacitor is coupled between the desaturation terminal and the ground so that the voltage of the blanking capacitor corresponds to a collector-emitter voltage of the IGBT when the IGBT is in the ON condition.

In some aspects, the techniques described herein relate to a power system, wherein the desaturation fault detection circuit includes: a current source coupled between a power source and the desaturation terminal of the gate driver; a desaturation switch coupled between the desaturation terminal and the ground, the desaturation switch configurable to clear the voltage of the blanking capacitor; and a comparator coupled at a first terminal to the desaturation terminal of the gate driver to receive the voltage of the blanking capacitor and coupled at a second terminal to a threshold voltage corresponding to the threshold.

In some aspects, the techniques described herein relate to a method for testing a power system including, the method including: receiving a test signal at a test terminal of a gate driver to begin a test; configuring a power transistor in an OFF condition; charging, by a desaturation fault detection circuit of the gate driver, a voltage of a blanking capacitor, the blanking capacitor coupled externally to the gate driver at a desaturation terminal of the gate driver; comparing, by the desaturation fault detection circuit, the voltage of the blanking capacitor to a threshold; and transmitting, by the desaturation fault detection circuit, a fault signal to a fault terminal of the gate driver when the voltage of the blanking capacitor exceeds the threshold.

In some aspects, the techniques described herein relate to a method, further including: not receiving the fault signal at the fault terminal in response to the test signal at the test terminal; failing the test; and determining from the test that failed: the desaturation fault detection circuit did not generate the fault signal; the blanking capacitor was not charged; or the power transistor was short circuited.

In some aspects, the techniques described herein relate to a method, further including: receiving the fault signal at the fault terminal in response to the test signal at the test terminal; passing the test; and determining from the test that passed: the desaturation fault detection circuit and the blanking capacitor are operating properly to detect a desaturation condition of the power transistor; and the power transistor is not short circuited.

In some aspects, the techniques described herein relate to a method, wherein the test is a first test, the test signal is a first test signal, and the fault signal is a first fault signal; the method further including: receiving a second test signal at an input terminal of the gate driver to begin a second test after the first test has passed; configurating the power transistor in an ON condition; configurating the desaturation fault detection circuit of the gate driver to receive the voltage of the blanking capacitor, the voltage of the blanking capacitor charged by the power transistor in the ON condition; comparing, by the desaturation fault detection circuit, the voltage of the blanking capacitor to the threshold; and transmitting, by the desaturation fault detection circuit, a second fault signal to the fault terminal of the gate driver when the voltage of the blanking capacitor exceeds the threshold.

In some aspects, the techniques described herein relate to a method, wherein the gate driver further includes an isolation barrier between a low-voltage side and a high-voltage side of the gate driver, the method further including: communicating the second test signal at the input terminal or the first test signal at the test terminal across the isolation barrier over a shared communication channel.

In some aspects, the techniques described herein relate to a method, further including: not receiving the second fault signal at the fault terminal in response to the second test signal at the input terminal; passing the second test; and determining from the second test that passed: a driver circuit of the gate driver is operating properly to transmit an ON signal to a gate of the power transistor to configure the power transistor in the ON condition; a desaturation sense circuit is operating properly to couple the blanking capacitor to a collector of the power transistor; and the power transistor is not open circuited.

In some aspects, the techniques described herein relate to a method, further including: receiving the second fault signal at the fault terminal in response to the second test signal at the input terminal; failing the second test; and determining from the second test that failed: a gate of the power transistor did not receive an ON signal from a driver circuit of the gate driver to configure the power transistor in the ON condition; the blanking capacitor was not coupled to a collector of the power transistor; or the power transistor was open circuited.

In some aspects, the techniques described herein relate to a method, wherein the power transistor is an insulated gate bipolar transistor (IGBT) coupled at a gate to a driver circuit of the gate driver, coupled at a collector to a desaturation sense circuit of the gate driver, and coupled at an emitter to a ground.

In some aspects, the techniques described herein relate to a gate driver including: a driver circuit configured to generate an output signal at an output terminal of the gate driver to control an ON/OFF condition of a power transistor according to an input signal at an input terminal of the gate driver; and a desaturation fault detection circuit configured, upon receiving a test signal at a test terminal of the gate driver, to: disable a desaturation switch coupled between a desaturation terminal of the gate driver and a ground so that a current source of the desaturation fault detection circuit can charge a voltage of a blanking capacitor that is coupled externally to the gate driver at the desaturation terminal; receive the voltage of the blanking capacitor at a first input of a comparator coupled to the desaturation terminal, the comparator having a second input coupled to a threshold voltage; and transmit a fault signal to a fault terminal of the gate driver when the voltage of the blanking capacitor exceeds the threshold voltage, the fault signal indicating that the desaturation fault detection circuit is functioning properly.

In some aspects, the techniques described herein relate to a gate driver, wherein the gate driver further includes: an isolation barrier between a low-voltage side and a high-voltage side; and a multiplexer configured to communicate the input signal at the input terminal of the gate driver and the test signal at the test terminal of across the isolation barrier over a shared communication channel.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 13 is a flow chart of a method for testing a power system according to a second possible implementation of the present disclosure.

The components in the drawings are not necessarily to scale relative to each other. Like reference numerals designate corresponding parts throughout the several views.

DETAILED DESCRIPTION

Switching large currents can be accomplished using a power transistor. The power transistor may be a metal oxide semiconductor field effect transistor (MOSFET) or an insulated gate bipolar transistor (IGBT). The power transistor may be fabricated using silicon (Si) or silicon carbide (SiC) processes. The power transistor may be configured in an ON condition to conduct current or an OFF condition to block current by a gate driver coupled to a controlling terminal (e.g., gate terminal) of the power transistor.

High current levels switched by the power transistor can be damaging or dangerous when a malfunction (i.e., fault) in the operation of the power transistor occurs. For example, excessive heat or fire may be generated by a power transistor in an over-current (e.g., short-circuit) condition. Accordingly, the gate driver may be configured with a fault detection circuit to monitor a condition of the power transistor and generate a fault signal when a high-current condition (e.g., over-current condition) occurs. In one possible implementation, the fault detection circuit may be configured to sense a desaturation condition of the power device to detect the high-current condition. In another possible implementation, the fault detection circuit may be configured to sense the current of the power device directly to detect the high-current condition. In either case, the fault detection circuits can be considered so vital to safety, that industries (e.g., automotive industries) may require that a power system occasionally test the function (i.e., action) of the protection circuits before beginning, or resuming, normal operation of the power system. The periodic testing of the fault detection circuitry can protect against a fault that occurs but fails to be detected by the fault detection circuit (i.e., a false-negative fault detection).

A false-negative fault detection can occur when a component of the fault detection circuit internal to the gate driver fails or operates not as specified, but a false-negative fault detection can also occur when another circuit or component in the power system external to the gate driver fails or operates not as specified. A problem with existing testing methods and circuitry is that they may be configured to test only the test circuit internal to the gate driver. The circuits and methods disclosed herein can expand the testing capability to include circuitry external to the gate driver. The disclosed circuits and methods use a shared communication channel for test signals and normal operation signals so that the additional testing can be accomplished without significantly increasing the complexity of the gate driver. The disclosed approach may have the technical effects of improving safety of a power system and providing more diagnostic information when a fault in the protection occurs, which can help troubleshooting, repair, or replacement.

Figure 1:
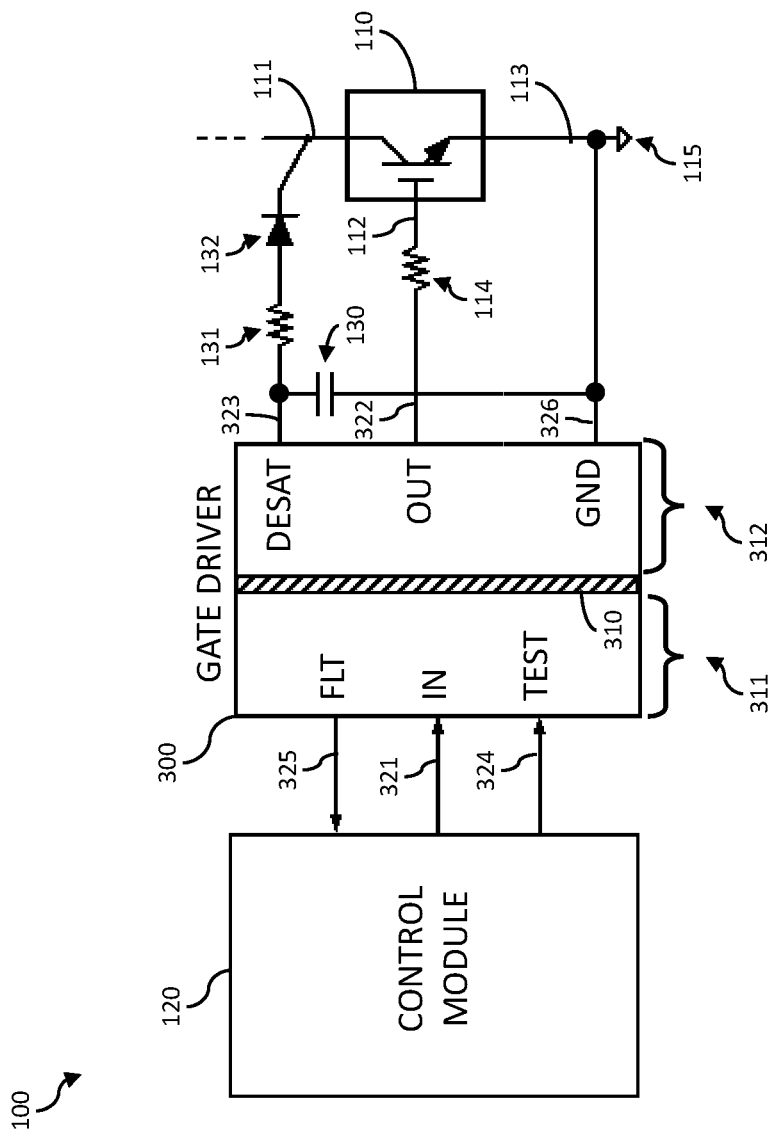
FIG. 1 illustrates a power system according to a first possible implementation of the present disclosure.

FIG. 1 illustrates a power system according to a first possible implementation of the present disclosure. The power system 100 includes a power transistor 110. As shown, the power transistor 110 may be implemented as an IGBT having a collector terminal 111, a gate terminal 112, and an emitter terminal 113. The power transistor is configurable in an ON condition (i.e., conducting) or an OFF condition (i.e., resisting) based on a signal at the gate terminal 112. The signal is generated at an output terminal 322 (OUT) of a gate driver 300 and coupled to the gate terminal 112 via a gate resistor 114. A fault (e.g., defect) in a gate resistor 114 can prevent the signal from the gate driver from reaching the power transistor 110. The emitter terminal 113 of the power transistor and a ground terminal 326 (GND) of the gate driver may be coupled to a ground 115.

An IGBT is typically in the saturation region while it is in the ON condition but can become desaturated when it is shorted or is conducting too much current. Accordingly, the power system 100 may include a desaturation sense circuit that is configured to sense a saturation state of the power transistor 110, while the gate driver transmits an ON signal to the power transistor 110 (e.g., while the power transistor is in the ON condition). The desaturation sense circuit can include a desaturation resistor 131 coupled to a desaturation terminal 323 (DESAT) of the gate driver. The desaturation sensor circuit can further include a blanking capacitor 130 coupled between the desaturation terminal 323 and the ground 115. The desaturation sense circuit can further include a diode 132. The diode is coupled between the desaturation resistor 131 and the collector terminal 111 of the power transistor 110. The diode 132 is oriented so that the anode of the diode is coupled to the desaturation resistor 131 and the cathode of the diode 132 is coupled to the collector terminal 111.

The desaturation sense circuit is configured to generate a voltage on the blanking capacitor 130 according to the voltage at the collector terminal 111. In other words, the voltage of the blanking capacitor can correspond to the collector-emitter voltage (i.e., forward voltage) of the power transistor 110. When the power transistor turns ON, a current source in the gate driver charges the blanking capacitor 130 and the diode 132 conducts. During normal operation the voltage of the blanking capacitor 130 is clamped (i.e., by the diode that is conducting) to the voltage at the collector of the power transistor 110 (i.e., the collector-emitter voltage). When the IGBT is shorted, the clamping is effectively removed so that the voltage of the blanking capacitor 130 is charged to a higher voltage. As will be discussed, the gate driver can monitor the voltage of the blanking capacitor 130 and generate a fault if this voltage rises too high. A fault (defect) in the blanking capacitor 130, the desaturation resistor 131, and/or the diode 132 can create a false-negative fault detection. For example, if the blanking capacitor 130 cannot be charged (e.g., is shorted) then the voltage at the desaturation terminal 323 (DESAT) may remain grounded regardless of the desaturation condition of the power transistor 110.

The gate driver 300 is an isolated gate driver that includes an isolation barrier 310 between a low-voltage side 311 and a high-voltage side 312. The isolation barrier can provide galvanic isolation between the sides while allowing signals to be inductively coupled (e.g., using a transformer) or electrically coupled (e.g., using a capacitor) between sides.

The high-voltage side 312 of the gate driver 300 includes a desaturation terminal 323 (DESAT) configured to transmit a current from a current source and receive a voltage of the blanking capacitor 130. The high-voltage side 312 further includes an output terminal 322 configured to transit an output signal to control an ON/OFF condition of the power transistor 110. The high-voltage side 312 further includes a ground terminal 326 (GND).

The low-voltage side 311 of the gate driver 300 includes an input terminal 321 (IN) configured to receive an input signal from a control module 120 having levels corresponding to the ON/OFF conditions of the power transistor 110. In other words, the gate driver 300 is configured to convert a low-voltage input signal to a high-voltage output signal to control the power transistor 110, and to protect (i.e., shield, isolate) the control module 120 from the high-voltages of the power transistor 110. The low-voltage side 311 further includes a test terminal 324 (TEST) configured to receive a test signal from the control module. The test signal can configure the gate driver to perform a test of its ability to detect a fault (i.e., its protection capabilities). The low-voltage side 311 further includes a fault terminal 325 (FLT) configured to transmit a fault signal to the control module, when a fault is detected.

The control module 120 may be a processor or controller that is configured by instructions to control the modes of the gate driver (e.g., test mode, normal mode, fault mode). For example, the control module 120 may transmit input signals to the gate driver 300 (i.e., normal mode) until it receives a fault signal from the gate driver. In response, the gate driver 300 may cease transmitting input signals to the gate driver (i.e., fault mode). Occasionally (e.g., at startup), the control module 120 may transmit test signals (i.e., test mode) intended to generate a fault. A fault received by the control module 120 in response to the test signals, can verify the operation of fault detection circuits of the gate driver 300. Further, the fault can further verify the operation of the desaturation sense circuit (e.g., blanking capacitor 130) and the power transistor 110 (e.g., not short circuited).

The operating protocols and test protocols for the power system 100 may be stored as instructions (e.g., software instructions) on a memory (e.g., non-transitory computer readable memory) accessible by the control module 120. For example, a method (i.e., computer implemented process) for testing the power system may be stored as computer readable instructions that, when recalled, can configured the control module 120 to transmit signals corresponding to a test of the fault protection capabilities of the power system 100. Further, the control module 120 may be configured to interpret the received signals and to generate a corresponding response.

In a possible implementation, the control module 120 may be configured to pass or fail a test based on the signals received in response to a test. Further, failing the test may include analyzing the signals from the test to determine the possible sources of failure. In other words, the disclosed approach includes diagnostics of the function of the fault (e.g., short-circuit) protection for the gate driver. The disclosed approach can use two tests to better diagnose a source of a failure.

Figure 2:
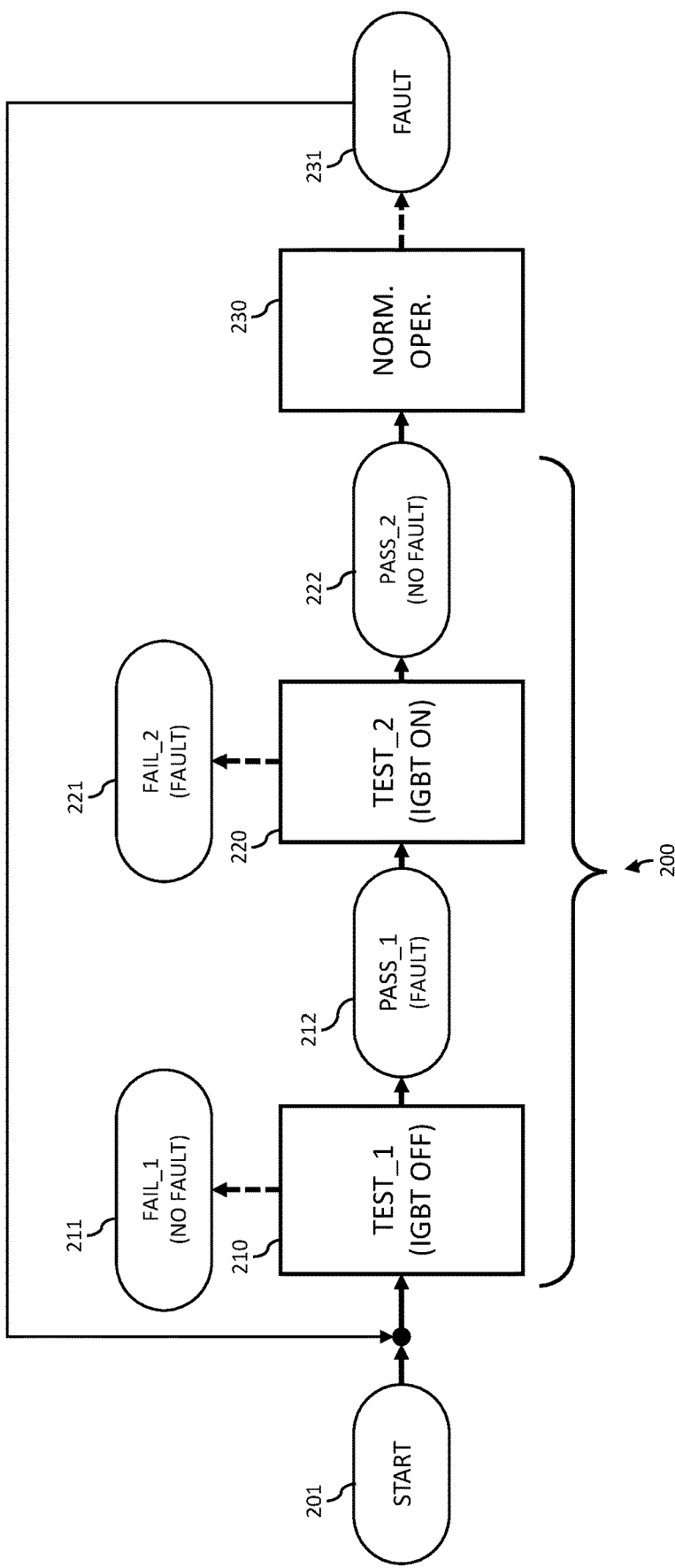
FIG. 2 is a flow chart illustrating desaturation fault-detection testing for the power system of FIG. 1.

FIG. 2 is a flow chart illustrating desaturation fault-detection testing for the power system of FIG. 1. The testing includes a two-test protocol 200 including a first test 210 (i.e., TEST_1) and a second test 220 (i.e., TEST_2) to test the fault detection capability (i.e., action) of the gate driver. The two-test protocol 200 may be executed (i) after startup 201 or (ii) after a fault 231 is detected during normal operation 230.

The first test 210 includes placing the power transistor 110 in the OFF condition (i.e., turning the power transistor OFF) and charging the blanking capacitor 130 so a voltage of the blanking capacitor at the desaturation terminal 323 (DESAT) can exceed a threshold during a period of the first test (i.e., first period). The threshold can be a fixed voltage that corresponds to a desaturation condition of the power transistor 110. The voltage on the blanking capacitor 130 is charged during the first test 210 to simulate a desaturation condition when it exceeds the threshold. It is not an actual desaturation condition (i.e., over current condition) because the power transistor 110 is in the OFF condition. The gate driver 300 is configured to monitor a fault terminal 325 (i.e., FLT) during the first period corresponding to the first test for a fault signal.

The first test 210 fails when no fault signal is received by the control module 120 during the first period. In the first-test failed state 211 (i.e., FAIL_1), some conclusions may be made about the operation of the power system 100. For example, not receiving the fault signal could indicate that the blanking capacitor 130 was not charged during the first period and may be evidence that the blanking capacitor is damaged (e.g., is short circuited). Not receiving the fault signal could also indicate that the power transistor 110 was not turned OFF during the first period and may be evidence that the power transistor 110 is short circuited. Not receiving the fault signal could also indicate that the blanking capacitor was properly charged, but the gate driver 300 did not generate a fault signal in response to the blanking capacitor 130 voltage being at or above the threshold, which could be evidence that desaturation fault detection circuitry in the gate driver is not operating properly.

The first test 210 passes when a fault signal is received by the control module 120 during the first period. In the first-test passed state 212 (i.e., PASS_1), some conclusions may be made about the operation of the power system 100. For example, the fault signal indicates that the blanking capacitor 130 was charged to a voltage exceeding the threshold, which would not be possible if the blanking capacitor 130 was damaged (e.g., short circuited) or the power transistor 110 was not OFF (e.g., short circuited). The fault signal further indicates that the gate driver 300 was operating properly to generate the fault signal in response to the blanking capacitor 130 voltage being at or above the threshold.

After the first test 210 passes, a second test 220 (i.e., TEST_2) may be performed. The second test 220 includes placing the power transistor 110 in the ON condition (i.e., turning the power transistor ON). In this condition, the blanking capacitor 130 is charged to a voltage corresponding to a desaturation condition of the power transistor 110, which corresponds to a level of the current conducted by the power transistor 110. In other words, the voltage on the blanking capacitor 130 is charged during the second test 220 according to the actual desaturation condition of the power transistor 110. When the blanking capacitor 130 voltage exceeds the threshold during a second period corresponding to the second test, the current in the power transistor 110 is too high and a fault exists. The gate driver 300 is configured to monitor a fault terminal 325 (i.e., FLT) during the second period corresponding to the second test for a fault signal.

The second test 220 fails when a fault signal is received by the control module 120 during the second period. In the second-test failed state 221 (i.e., FAIL_2), some conclusions may be made about the operation of the power system 100. For example, receiving the fault signal could indicate that the desaturation resistor 131 or diode 132 is damaged (e.g., open circuited) so that the blanking capacitor 130 was not coupled to the collector terminal 111 of the power transistor 110. Receiving the fault signal could also indicate that the power transistor 110 is not capable of being turned ON (e.g., is open circuited). Not receiving the fault signal could also indicate that the gate driver 300 did not properly configure the power transistor 110 in the ON condition. For example, the output terminal 322 of the gate driver and/or the gate resistor 114 prevented an ON signal from being applied to the gate terminal 112 of the power transistor 110.

The second test 220 passes when no fault signal is received by the control module 120 during the second period. In the second-test passed state 222 (i.e., PASS_2), some conclusions may be made about the operation of the power system 100. For example, not receiving the fault signal indicates that the power transistor was turned ON and the desaturation resistor 131 and the diode 132 coupled the blanking capacitor 130 to the collector terminal 111.

After the first test 210 and the second test 220 have passed, then the gate driver 300 and the control module 120 may operate normally. Normal operation 230 may include the control module 120 transmitting ON/OFF input signals to the input terminal 321 of the gate driver 300. The gate driver 300 continues to monitor the desaturation condition (i.e., current condition) of the power transistor 110 during normal operation 230. A high current in the power transistor 110 (e.g., due to a short circuit) may cause the gate driver 300 to generate a fault signal at the fault terminal 325 that is received by the control module 120. This fault 231 during normal operation may trigger the two-test protocol 200 to be repeated in order to help diagnose the problem with the power system 100.

The control module 120 may be configured to shutdown operation of the power system 100 in the event of a fault. Further, the controller may be configured to generate messages or signals to indicate a type of failure based on the results of the two-test protocol 200. The type may correspond to a component, or components, likely responsible for the failure. One technical advantage of the present approach is that more components are tested in the two-test protocol 200 than in other approaches, and the tested components include components external to the gate driver 300.

Figure 3:
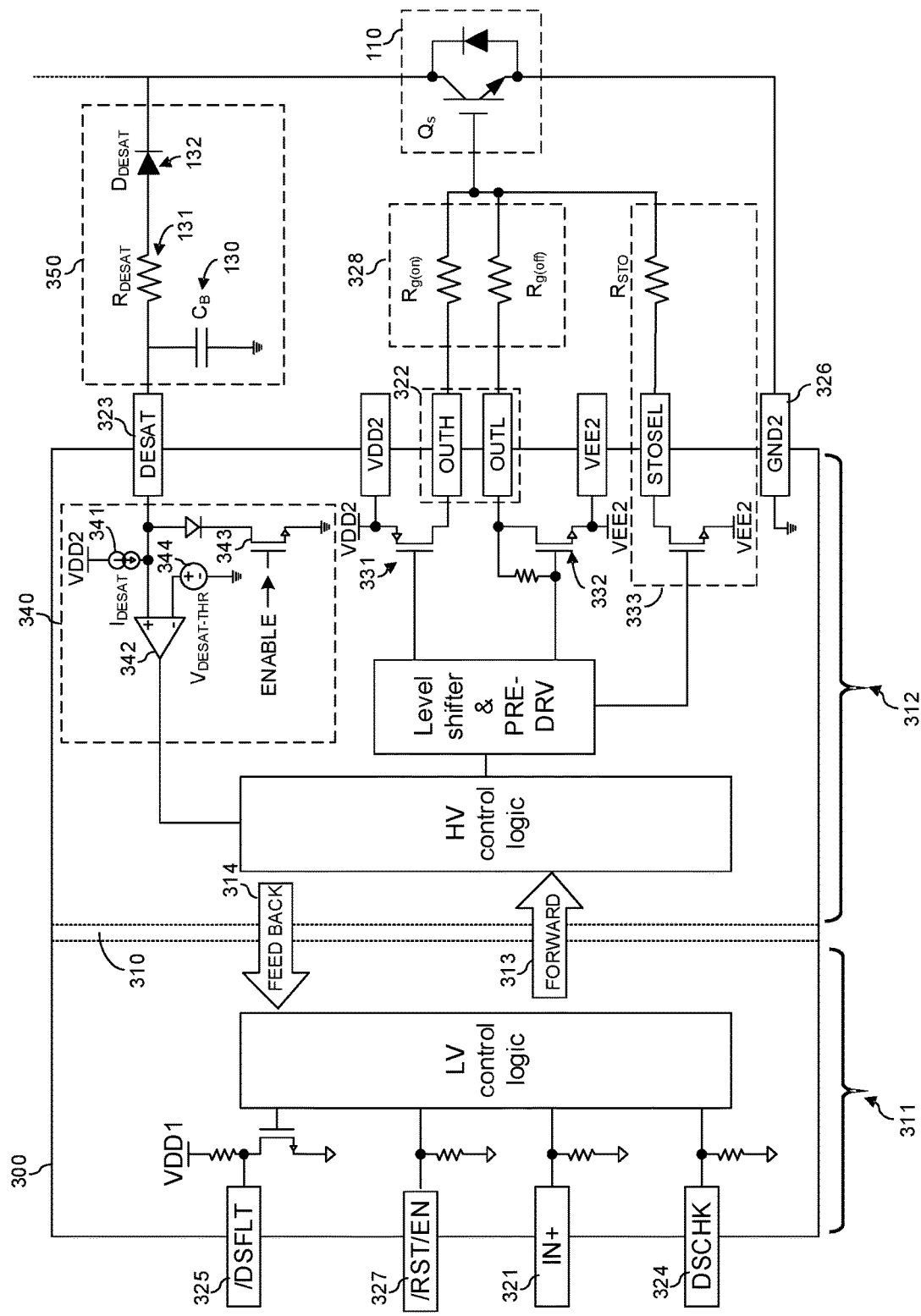
FIG. 3 is a block diagram that schematically illustrates a gate driver configured for desaturation sensing according to a possible implementation of the present disclosure.

FIG. 3 is a block diagram that schematically illustrates a gate driver according to a possible implementation of the present disclosure. As discussed previously, the gate driver 300 includes a low-voltage side 311 and a high-voltage side 312 isolated (e.g., galvanic isolation) by an isolation barrier 310. Signals can be communicated across the isolation barrier 310 from the low-voltage side 311 to the high-voltage side 312 using a forward communication channel 313. Signals can be communicated across the isolation barrier 310 from the high-voltage side 312 to the low-voltage side 311 using a feedback communication channel 314.

The gate driver 300 may be configured to receive input (e.g., from the control module) on the low-voltage side 311 at an input terminal 321 (i.e., IN+), a test terminal 324 (i.e., DSCHK) and transmit a fault signal (e.g., to the control module) at a fault terminal 325 (i.e., /DSFLT). Additionally, a reset signal or enable signal may be received at a reset terminal 327 (i.e., /RST/EN). For example, a reset signal can be transmitted to the reset terminal 327 in order to clear (i.e., change states of) a fault signal at the fault terminal 325.

The gate driver 300 includes a driver circuit to generate signals to control the power transistor to an ON/OFF condition. The driver circuit can include an output terminal 322 that includes a high output (i.e., OUTH) and a low output (i.e., OUTL) coupled to a gate resistor network 328. The driver circuit may further include a high-side transistor 331 and a low-side transistor 332. The driver circuit can be controlled by an input signal at the input terminal 321 communicated over the forward communication channel 313. The high-side transistor 331, the low-side transistor 332, and the gate resistor network 328 may be considered part of an output stage (i.e., OUT STAGE) of the driver circuit.

To turn ON the power transistor 110, the high-side transistor 331 may be configured in an ON condition to couple an upper high-voltage rail (VDD2) to the gate terminal of the power transistor 110 via a first gate resistor (Rg(on)) of a gate resistor network 328 while a low-side transistor 332 is in an OFF condition. To turn OFF the power transistor 110, the low-side transistor 332 may be configured in an ON condition to couple a lower high-voltage rail (VEE2) to the gate terminal of the power transistor 110 via a second gate resistor (Rg(off)) of a gate resistor network 328, while a high-side transistor 331 is in an OFF condition. In a possible implementation, the driver further includes a shutdown circuit 333 configured to turn the power transistor 110 OFF if a fault is detected.

The gate driver 300 includes a desaturation fault detection circuit 340, that when enabled, is configured to receive a voltage from a desaturation sense circuit 350 coupled at the desaturation terminal 323 of the gate driver. As discussed, the desaturation sense circuit 350 includes a desaturation resistor 131 ($R_{DESAT}$) and a diode 132 ($D_{DESAT}$). The desaturation resistor and the diode can be configured to couple a blanking capacitor 130 ($C_B$) to a terminal (e.g., collector terminal) of the power transistor 110. The voltage received by the desaturation fault detection circuit 340 is the voltage of the blanking capacitor 130.

The desaturation fault detection circuit 340 includes a comparator 342 and can be enabled to compare the voltage of the blanking capacitor 130 to a desaturation fault detection voltage (i.e., threshold voltage 344) using a desaturation switch 343 (i.e., DESAT SW) coupled between the desaturation terminal 323 and the ground 115. For example, the desaturation switch 343 may be turned ON to ground the desaturation terminal 323 (i.e., clear the voltage of the blanking capacitor) in order to disable the desaturation fault detection circuit 340. Alternatively, the desaturation fault detection circuit 340 may be enabled when the desaturation switch 343 is OFF. The signal to enable the desaturation fault detection circuit 340 can be triggered by the power transistor 110 being ON (i.e., conducting). Additionally, the desaturation fault detection circuit 340 can be enabled by a test signal when the power transistor 110 is OFF in order to test the desaturation fault detection circuit 340.

The desaturation fault detection circuit 340 includes a current source 341 coupled between a power source (VDD2) and the desaturation terminal 323. The current source 341 is configured to charge the blanking capacitor 130 to a voltage. When the power transistor 110 is ON, this voltage is clamped to the collector voltage (i.e., desaturation voltage) of the power transistor 110 and represents the current level in the power transistor 110. When the power transistor is OFF and the desaturation fault detection circuit 340 is enabled (i.e., TEST_1), this voltage can be charged to a level that is higher than the threshold voltage 344. When the voltage of the blanking capacitor 130 is greater than or equal to the threshold voltage 344, then the comparator 342 may output a fault signal that can be communicated over the feedback communication channel 314 to the fault terminal 325.

The desaturation fault detection circuit 340 can be enabled by a test signal at the test terminal 324 or a test signal at an input terminal 321. The test signals are communicated over a shared communication channel. In particular, the desaturation fault detection circuit 340 may be enabled while the power transistor 110 is configured in the OFF condition for the first test 210 by a first test signal received at the test terminal 324 of the gate driver 300. Also, the desaturation fault detection circuit 340 may be enabled while the power transistor 110 is configured in the ON condition for the second test 220 by a second test signal received at the input terminal 321 of the gate driver 300. The shared communication channel may enable a two-test protocol 200 without a significant increase in the complexity of the gate driver 300.

Figure 4:
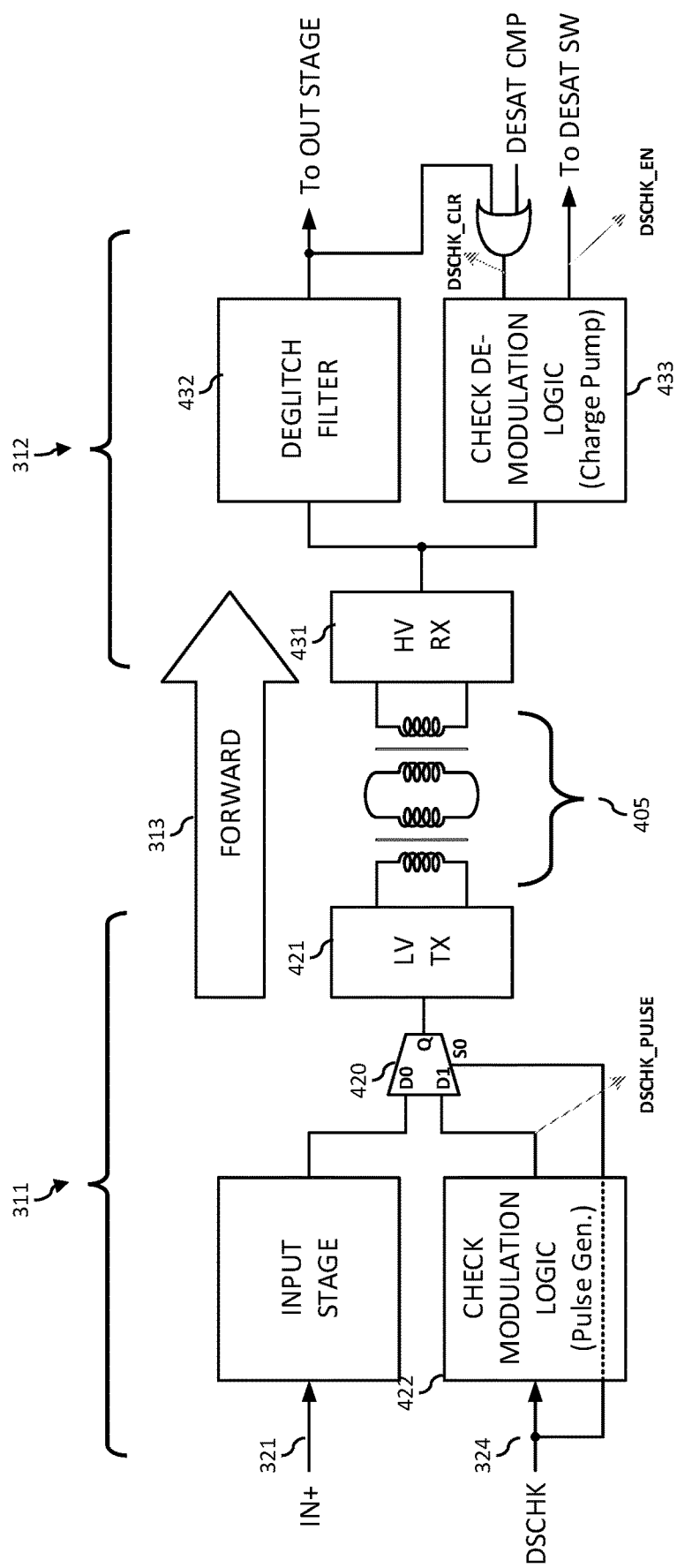
FIG. 4 illustrates a shared communication channel for a gate driver according to a possible implementation of the present disclosure.

FIG. 4 illustrates a shared communication channel for a gate driver according to a possible implementation of the present disclosure. As mentioned, the forward communication channel 313 is a shared communication channel configured to transmit signals from the input terminal 321 or the test terminal 324 across the isolation barrier 310. The isolation barrier can be crossed using electrical coupling or magnetic coupling. For the implementation shown in FIG. 4, magnetic (i.e., inductive) coupling is achieved using a transformer 405 between the low-voltage side 311 and the high-voltage side 312 of the gate driver. The gate driver includes a multiplexer 420 that is configured to couple the input signal (IN+) at the input terminal to a low-voltage transmitter 421 (LV TX). When a test signal is received at the test terminal, the multiplexer 420 is configured to couple a modulated version of the test signal (i.e., DSCHK_PULSE) to the low-voltage transmitter 421 (LV TX). The gate driver includes a pulse generator 422 that is configured to generate a series of pulses corresponding to the test signal. For example, the pulse generator 422 may start generating a series of pulses (i.e., pulse train) when the test signal begins and may stop when the test signal ends, where the period between the start and the stop corresponds to the test period. The pulse train is coupled by the transformer 405 to a high-voltage receiver 431 (HV RX). The gate driver further includes a deglitch filter 432 (e.g., low pass filter) coupled between the high-voltage receiver 431 and the driver circuit. The deglitch filter 432 is configured to block the pulse train during the first test and to pass an input signal (IN+) of sufficient duration to activate the second test. The gate driver further includes a charge pump 433 configured to output a signal (DSCHK_EN) that can enable the desaturation fault detection circuit 340. For example, the output of the charge pump can control the desaturation switch 343. The output of the charge pump is cleared by a clear signal (DSCHK_CLR) so that the desaturation fault detection circuit 340 is disabled (e.g., desaturation switch 343 is turned ON) whenever the power transistor 110 is ON and/or after the test has concluded (i.e., after the test period).

Input signals for the power transistor 110 are passed by the deglitch filter 432 to the output stage (OUT STAGE) of the gate driver. The input signals do not reach the desaturation switch 343 because, in this condition, the charge pump 433 is disabled and the power transistor 110 is turned ON. Test signals for the desaturation fault detection circuit 340 are blocked by the deglitch filter 432. In this condition, the charge pump is enabled, and its output controls the desaturation switch 343 to enable the desaturation fault detection circuit 340. As a result, the input signal at the input terminal and the test signal at the test terminal can be communicated across the isolation barrier over a shared communication channel including the low-voltage transmitter 421, the transformer 405, and the high-voltage receiver 431.

In the following figures, signals at various locations in the power system 100 will be shown for a few possible test and operating scenarios. These timing diagrams (graphs) will help further explain the operation of the power system; however, the invention is not limited to these examples. Descriptions of the graphed signals are provided in TABLE 1 below.

TABLE 1

EXAMPLE SIGNALS OF THE POWER SYSTEM

| SIGNAL | DESCRIPTION |
| --- | --- |
| IN+ | Input signal at input terminal |
| DSCHK | First test signal (Test_1) at test terminal |
| DSCHK_FILT | Delayed Test_1 signal |
| DSCHK_PULSE | Output of pulse generator on LV side of forward comm. ch. |
| DSCHK_CP | Output of charge pump on HV side of forward comm. ch. |
| DSCHK_EN | Enable signal for desaturation fault detection circuit (HIGH = Enable) |
| DSCHK_CLR | Clear signal for charge pump |
| DESAT | Signal at desaturation terminal (voltage of $C_B$) |
| DESAT_OUT | Output of comparator of desaturation fault detection circuit (HIGH = FAULT) |
| OUTH/L | Signal at output terminal (HIGH = ON, LOW = OFF) |
| /DSFLT | Fault signal indicating a desaturation fault condition (LOW = FAULT) |
| /RST/EN | Reset signal to clear desaturation fault condition (/DSFLT) (LOW = RESET) |

Figure 5:
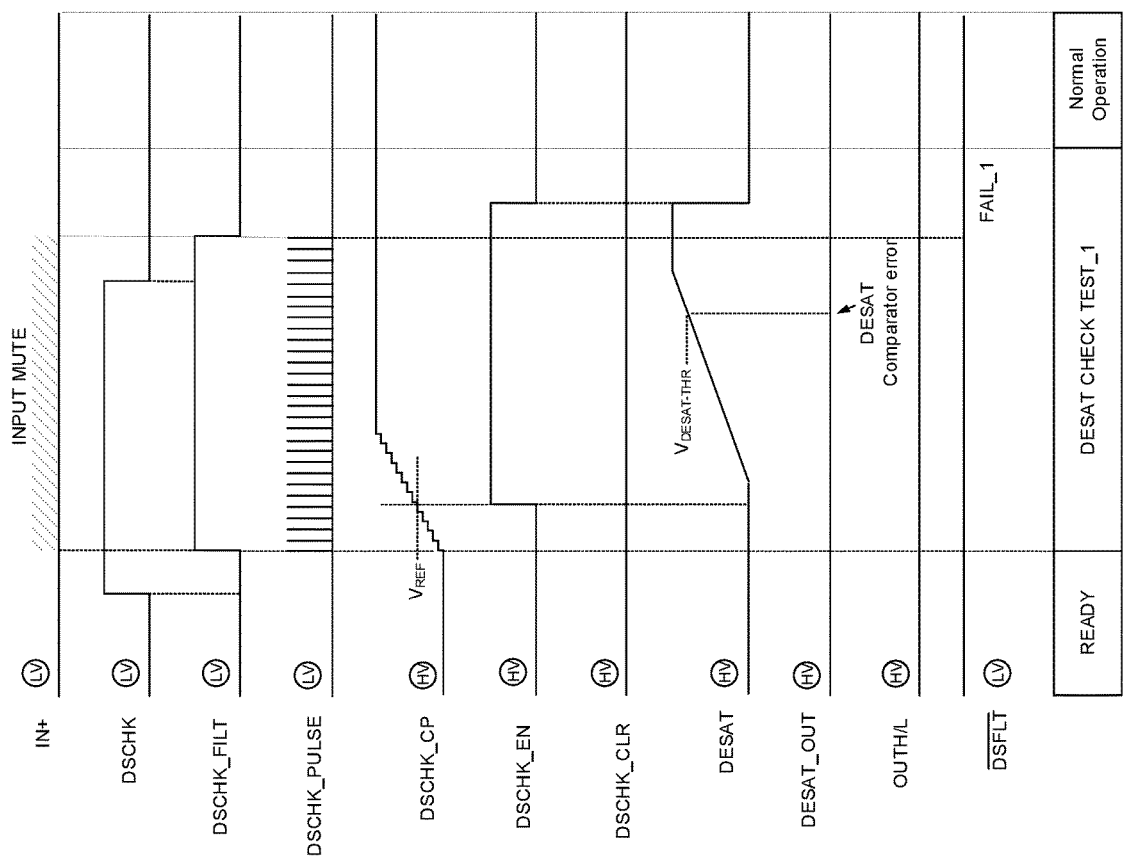
FIG. 5 illustrates signals of a power system during a first test (i.e., DESAT CHECK TEST_1) that lead to a first-test failed state (i.e., FAIL_1) according to a first possible implementation of the present disclosure.

FIG. 5 illustrates signals of a power system during a first desaturation test (i.e., DESAT CHECK TEST_1) that lead to a first-test failed state (i.e., FAIL_1) according to a first possible implementation of the present disclosure. In the first test (i.e., TEST_1), the power transistor can be maintained in an OFF state by output signals (i.e., OUT H/L) that are LOW in response to an input signal (i.e., IN+) that is LOW. The first test can be triggered by a HIGH desaturation check signal (i.e., DSCHK) at the test terminal. The first test signal can be communicated across the isolation barrier to generate a corresponding desaturation check enable signal (i.e., DSCHK_EN) for the at the desaturation switch of the desaturation fault detection circuit.

The desaturation check enable signal (i.e., DSHK_EN) can result from the following process. A HIGH DSCHK signal received at the test terminal can be applied to a filter to generate a desaturation check filter signal (i.e., DSCHK_FILT), which is a delayed version of the first test signal. The DSCHK_FILT signal can then be applied to a pulse generator to generate a desaturation check pulse signal (i.e., DSCHK_PULSE). The DSCHK_PULSE signal can be communicated over the shared communication channel and received by a charge pump circuit that generates a desaturation check charge pump signal (i.e., DSCHK_CP) from the series of pulses. The DSCHK_CP signal can then be applied to check demodulation logic to generate the desaturation check enable signal (i.e., DSCHK_EN), which can enable the desaturation fault detection circuit when at a HIGH level.

After being enabled, the desaturation fault detection circuit can charge the blanking capacitor to generate a desaturation signal (i.e., DESAT). In the graphs shown, the first test fails because a desaturation fault signal (i.e., /DSFLT) fails to indicate a FAULT (i.e., fails to go LOW), as expected for the first test. The source of this failure is the comparator, which outputs a desaturation output signal (i.e., DESAT_OUT) that remains in a low condition (i.e., NO FAULT) despite the DESAT signal being larger than the threshold. In proper operation, the DESAT_OUT signal would transition when the DESAT voltage becomes greater than or equal to the threshold, and the transition to the DESAT_OUT signal would cause a corresponding transition in the /DSFLT signal. Accordingly, FIG. 5 illustrates a first test that fails for the reason of a comparator error.

Figure 6:
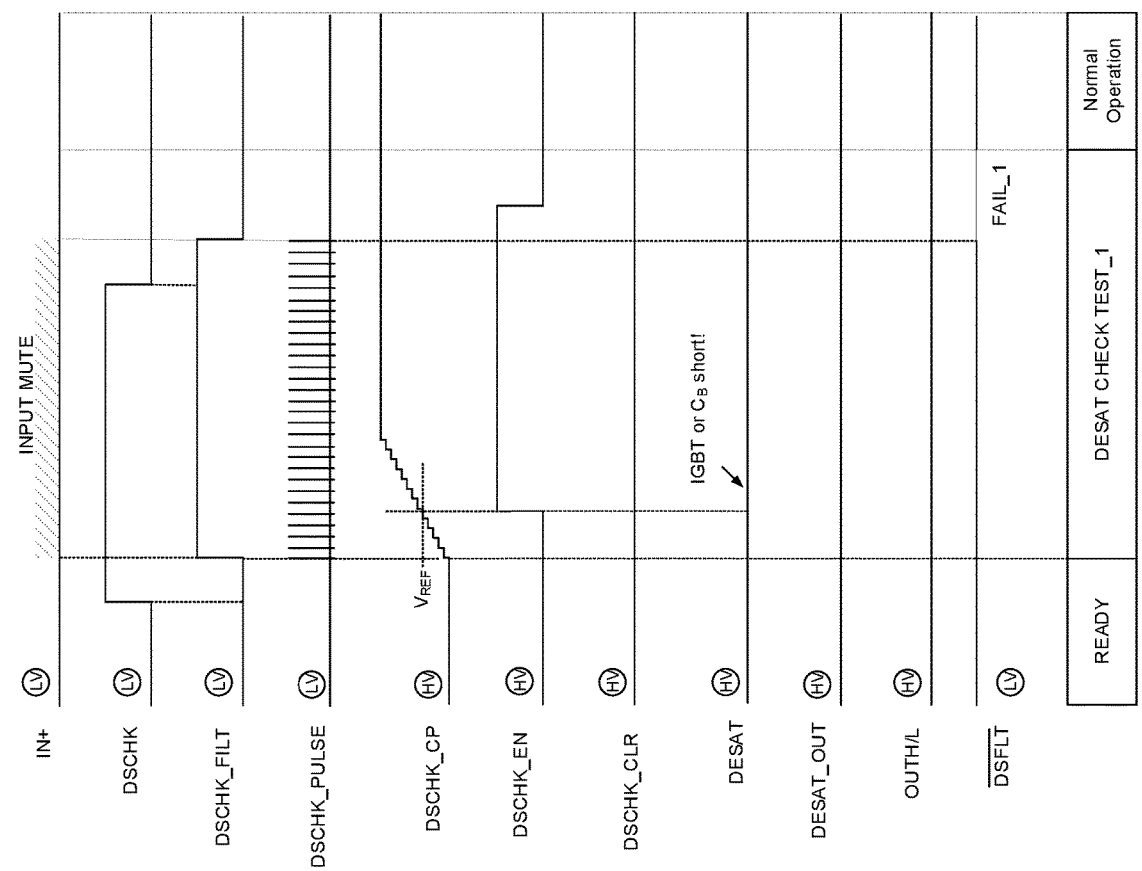
FIG. 6 illustrates signals of a power system during a first test (i.e., DESAT CHECK TEST_1) that lead to a first-test failed state (i.e., FAIL_1) according to a second possible implementation of the present disclosure.

FIG. 6 illustrates signals of a power system during a first test (i.e., DESAT CHECK TEST_1) that lead to a first-test failed state (i.e., FAIL_1) according to a second possible implementation of the present disclosure. As shown, the first test fails because the /DSFLT signal fails to indicate a FAULT (i.e., fails to go LOW), as expected for the first test. The failure results because the DESAT signal fails to increase during the first test. This failure to increase can result from a short circuited (i.e., shorted) power transistor (e.g., IGBT) and/or a short circuited blanking capacitor ($C_B$). In proper operation, the blanking capacitor would be charged by the desaturation fault detection circuit to a voltage that is greater than or equal to the threshold (i.e., $V_{DESAT-THR}$) so that the DESAT_OUT signal would transition and trigger the /DSFLT signal to transition to a LOW level (i.e., FAULT). Accordingly, FIG. 6 illustrates a first test that fails because the power transistor and/or the blanking capacitor was short circuited.

Figure 7:
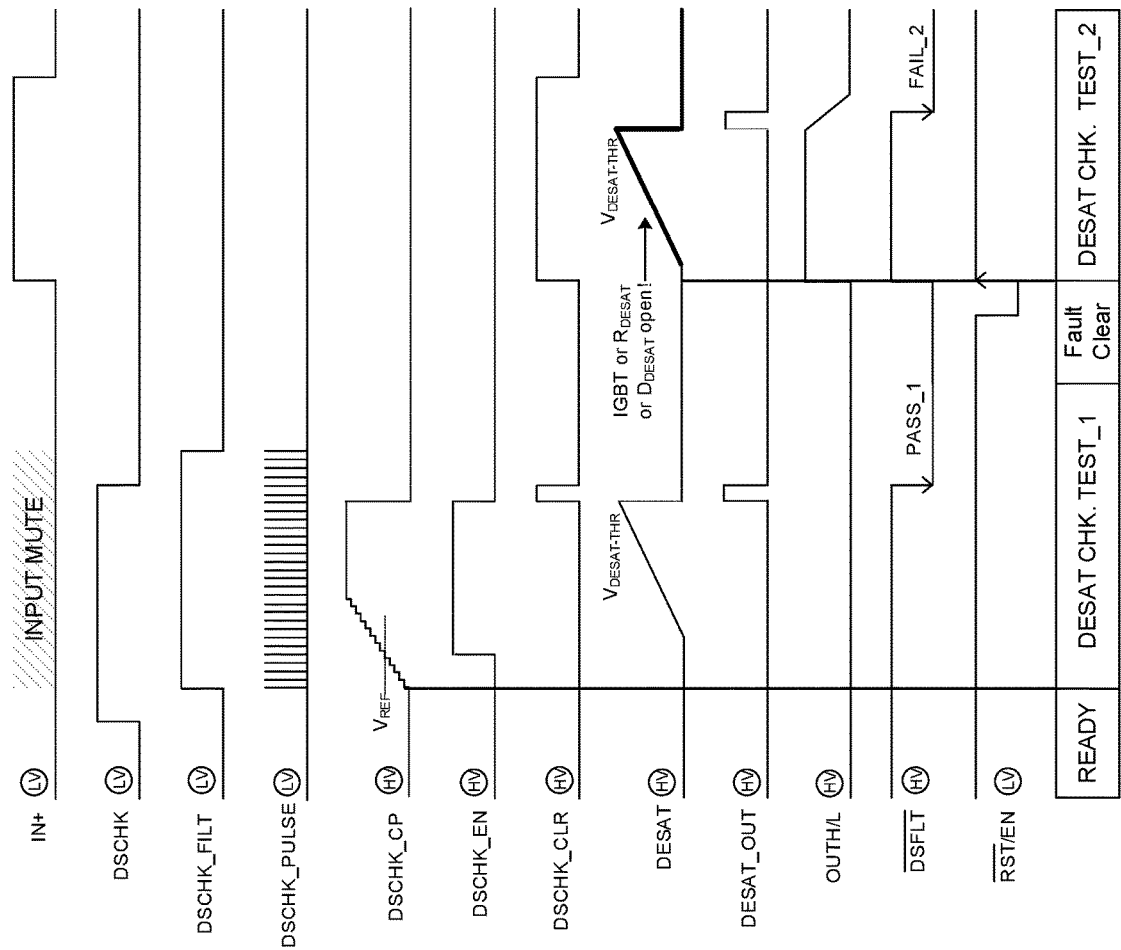
FIG. 7 illustrates signals of a power system during a second test (i.e., DESAT CHECK TEST_2) that lead to a second-test failed state (i.e., FAIL_2) according to a first possible implementation of the present disclosure.

FIG. 7 illustrates signals of a power system during a second test (i.e., DESAT CHECK TEST_2) that lead to a second-test failed state (i.e., FAIL_2) according to a first possible implementation of the present disclosure. As shown, the first test (i.e., DESAT CHECK TEST_1) passes because the /DSFLT signal transitions LOW (i.e., indicates a fault) as expected in response to the DESAT signal being greater than or equal to the threshold. As a result, it can be concluded that the power transistor is not shorted, the blanking capacitor can be charged (e.g., is not shorted), and the comparator is functioning properly. Accordingly, the two-test protocol can proceed to the second test after a reset signal (i.e., /RST/EN) resets the /DSFLT signal to the NO FAULT condition (i.e., HIGH).

The second test can be activated (i.e., triggered) by a HIGH input signal (i.e., IN+) at the input terminal. The IN+ signal can be communicated across the isolation barrier to generate output signals (i.e., OUT H/L) that configure the power transistor in an ON condition. The charge pump and demodulation logic used in the first test are disable by the DSCHK_CLR signal that is HIGH during the second test. The DESAT signal increases as the blanking capacitor is charged by the current source of the desaturation fault detection circuit to a voltage corresponding to a terminal of the power transistor. As shown, the second test fails because the DESAT signal increases to a level that is greater than or equal to the desaturation threshold voltage ($V_{DESAT-THR}$). From the signals, it can be concluded that the voltage on the blanking capacitor was not clamped by the collector of the power transistor, despite the OUTH/L signals being HIGH to turn ON the power transistor. As a result, the desaturation fault detection circuit transitions its output signal (i.e., DESAT_OUT) to trigger the /DSFLT signal to go LOW (i.e., FAULT). From this failure, it can be concluded that the voltage on the blanking capacitor was not clamped by the collector of the power transistor. This can occur when the blanking capacitor is not properly coupled to the collector of the power transistor, which can result from a fault in the desaturation resistor ($R_{DESAT}$) or desaturation diode ($D_{DESAT}$). Alternatively, this failure to clamp the blanking capacitor voltage can result from the power transistor being open circuited.

Figure 8:
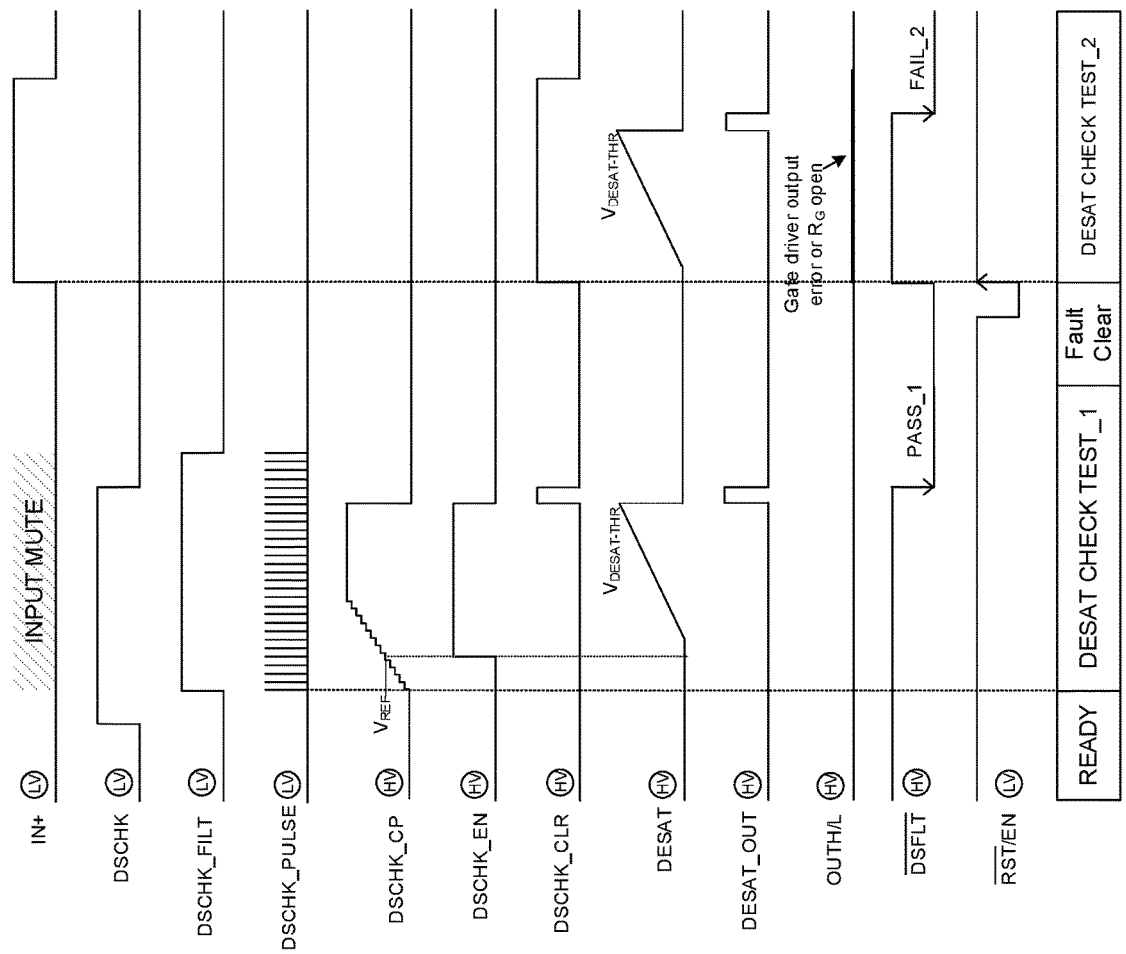
FIG. 8 illustrates signals of a power system during a second test (i.e., DESAT CHECK TEST_2) that lead to a second-test failed state (i.e., FAIL_2) according to a first possible implementation of the present disclosure.

FIG. 8 illustrates signals of a power system during a second test (i.e., DESAT CHECK TEST_2) that lead to a second-test failed state (i.e., FAIL_2) according to a second possible implementation of the present disclosure. As shown, the second test fails because the DESAT signal increases to a level that is greater than or equal to the desaturation threshold voltage ($V_{DESAT-THR}$). As a result, the desaturation fault detection circuit transitions its output signal (i.e., DESAT_OUT) to trigger /DSFLT signal to go LOW (i.e., FAULT). From this failure, it can be concluded that the voltage on the blanking capacitor was not clamped by the collector of the power transistor. This can occur when the gate of the power transistor did not receive the ON signal from the driver circuit (i.e., was OFF during the test), which can result from a fault in the driver circuit (e.g., high-side transistor or low-side transistor) or the gate resistor network.

Figure 9:
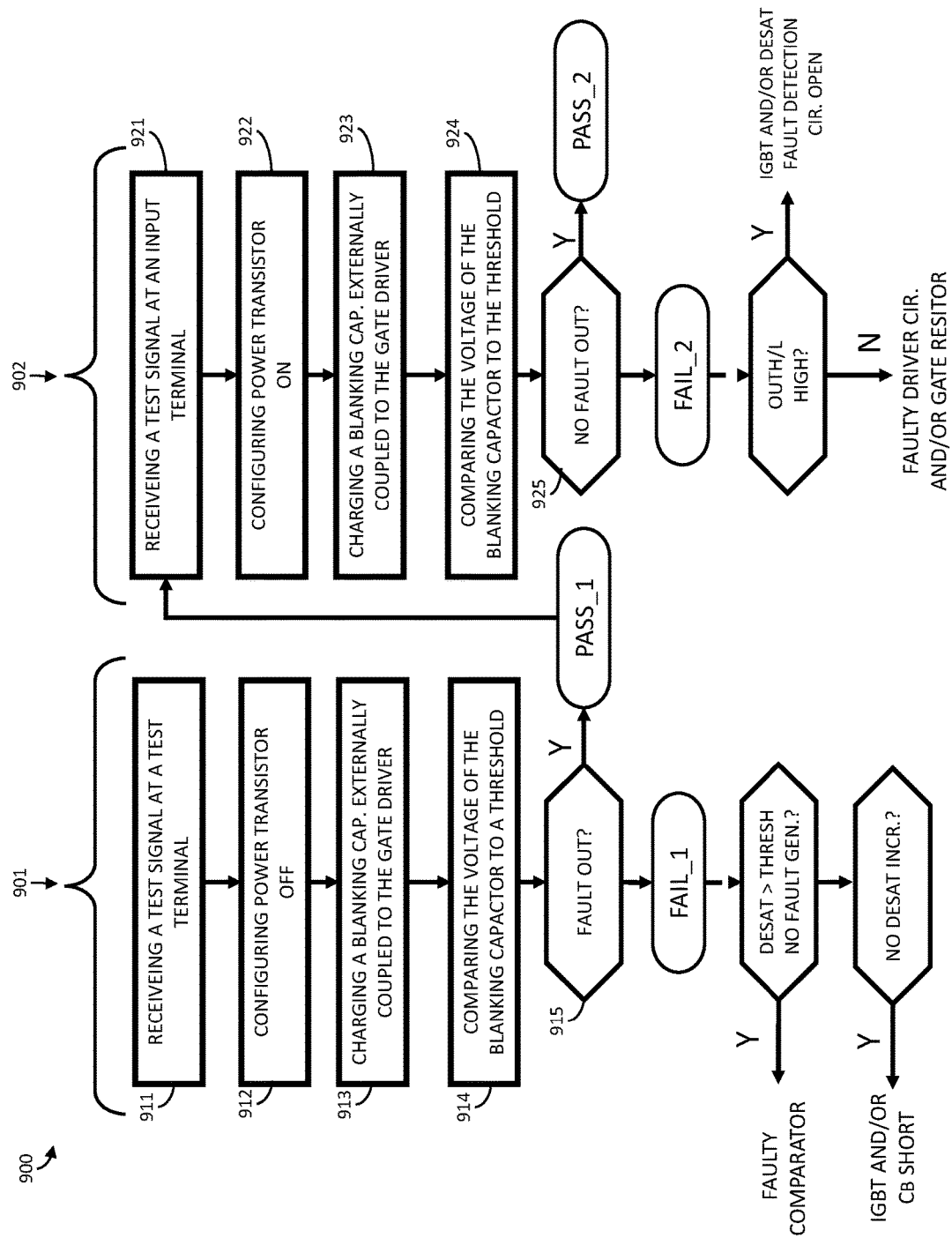
FIG. 9 is a flow chart of a method for testing a power system according to a first possible implementation of the present disclosure.

FIG. 9 is a flow chart of a method for testing a power system according to a first possible implementation of the present disclosure. The method 900 includes a first test 901 and a second test 902. The second test 902 is performed when the first test 901 is passed (i.e., PASS_1), otherwise the second test 902 is not performed.

The first test 901 includes receiving 911 a test signal at a test terminal of the gate driver. The first test further includes configuring 912 a power transistor, coupled to the gate driver, in an OFF condition. The first test 901 further includes charging 913 a voltage of a blanking capacitor using a desaturation fault detection circuit of the gate driver. The blanking capacitor is externally coupled to the gate driver at a desaturation terminal. The first test 901 further includes comparing 914 the voltage of the blanking capacitor to a threshold using the desaturation fault detection circuit of the gate driver. A fault terminal of the gate driver can be monitored for a fault. If a fault is output 915 as a result of the charging, then the first test passes (PASS_1), otherwise no fault is generated, and the first test fails (FAIL_1).

In a possible implementation, the first test 901 may further include determining likely sources of the failure. For example, if the voltage of the blanking capacitor (i.e., DESAT signal) exceeded the threshold during the first test but no fault was generated, then the first test likely failed due to a faulty comparator. In another example, if the voltage of the blanking capacitor (i.e., DESAT signal) does not increase during the first test (e.g., is approximately ground), then the first test likely failed due to a short in either (or both) of the power transistor (e.g., IGBT) or the blanking capacitor (i.e., $C_B$).

The second test 902 includes receiving 921 a test signal at a test terminal of the gate driver. The second test 902 further includes configuring 922 a power transistor, coupled to the gate driver, in an ON condition. The second test 902 further includes charging 923 a voltage of a blanking capacitor using a desaturation fault detection circuit of the gate driver. The blanking capacitor is externally coupled to the gate driver at a desaturation terminal. The second test 902 further includes comparing 924 the voltage of the blanking capacitor to the threshold using the desaturation fault detection circuit of the gate driver. A fault terminal of the gate driver can be monitored for a fault. If no fault is output 925 as a result of the charging, then the second test passes (PASS_2), otherwise a fault is generated, and the second test fails (FAIL_2).

In a possible implementation, the second test 902 may further include determining likely sources of the failure. For example, if the output of the gate driver (i.e., OUTH/L signal) is HIGH to turn on the power transistor and the voltage of the blanking capacitor exceeded the threshold, then the second test likely failed due to the power transistor (e.g., IGBT) and/or the desaturation sense circuit being open circuited. In another example, if the output of the gate driver (i.e., OUTH/L signal) is LOW so that the power transistor remains OFF then the second test likely failed due to a faulty driver circuit (e.g., high-side transistor, low-side transistor) or a faulty (e.g., open) gate resistor.

Thus far, the fault protection circuitry tested was for sensing a desaturation (i.e., DESAT) condition as an indicator of high current in the power transistor. A high current condition in a power transistor may also be sensed by sensing the current conducted by the power transistor using a sensor (e.g., resistor) in series with the power transistor in what is called a current sense (CS) approach.

Figure 10A:
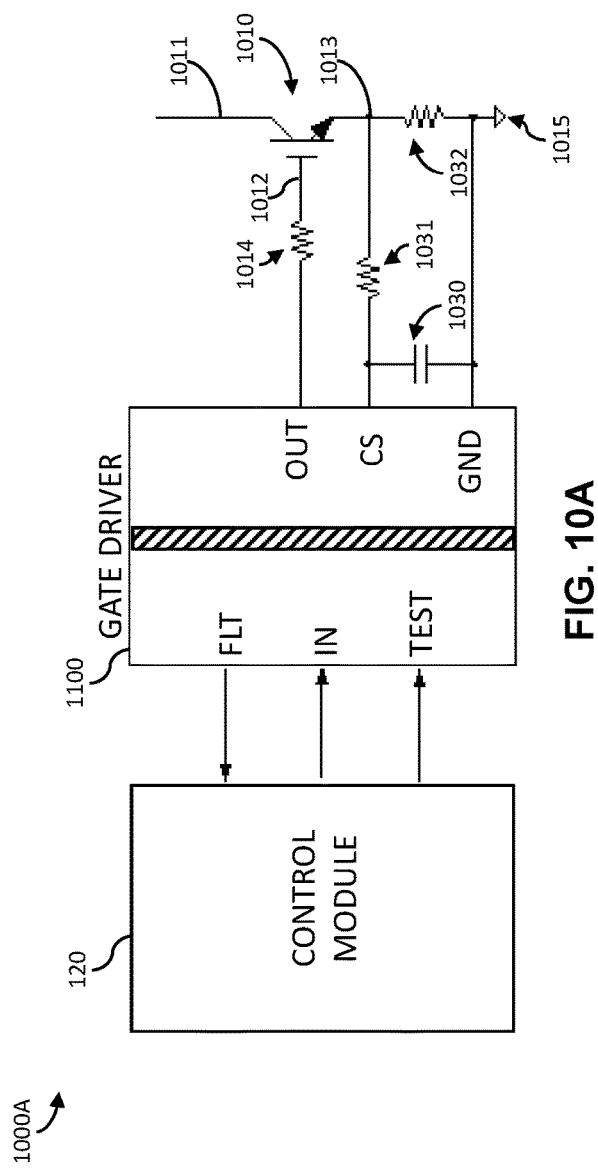
FIG. 10A illustrates a power system according to a second possible implementation of the present disclosure.

FIG. 10A illustrates a power system according to a second possible implementation of the present disclosure. The power system 1000A includes a power transistor 1010. As shown, the power transistor 1010 may be implemented as a three terminal IGBT including a collector terminal 1011, a gate terminal 1012, and an emitter terminal 1013. The power transistor is configurable in an ON condition (i.e., conducting) or an OFF condition (i.e., resisting) based on a signal at the gate terminal 1012. The signal is generated at an output terminal (OUT) of a gate driver 1100 and coupled to the gate terminal 1012 via a gate resistor 1014. The emitter terminal 1013 of the power transistor 1010 and a ground 1015 are coupled to a ground terminal (GND) of the gate driver 1100.

The gate driver 1100 includes a current sense (CS) terminal that is coupled to a current sense circuit. The current sense circuit (i.e., CS circuit) includes a current-sense resistor 1032 ($R_{SENSE}$) configured to convert a current flowing through the power transistor 1010 into a voltage. The current-sense resistor 1032 is coupled between the emitter terminal 1013 of the power transistor 1010 and the ground 1015. The emitter terminal 1013 of the power transistor 1010 is coupled to the CS terminal of the gate driver 1100 via a current-sense filter (e.g., low-pass filter). The current-sense filter includes a filter resistor 1031 (i.e., $R_F$) coupled between the emitter terminal 1013 and the CS terminal of the gate driver and a filter capacitor 1030 (i.e., $C_F$) coupled between the CS terminal of the gate driver 1100 and the ground terminal (GND) of the gate driver (i.e., ground 1015).

Figure 10B:
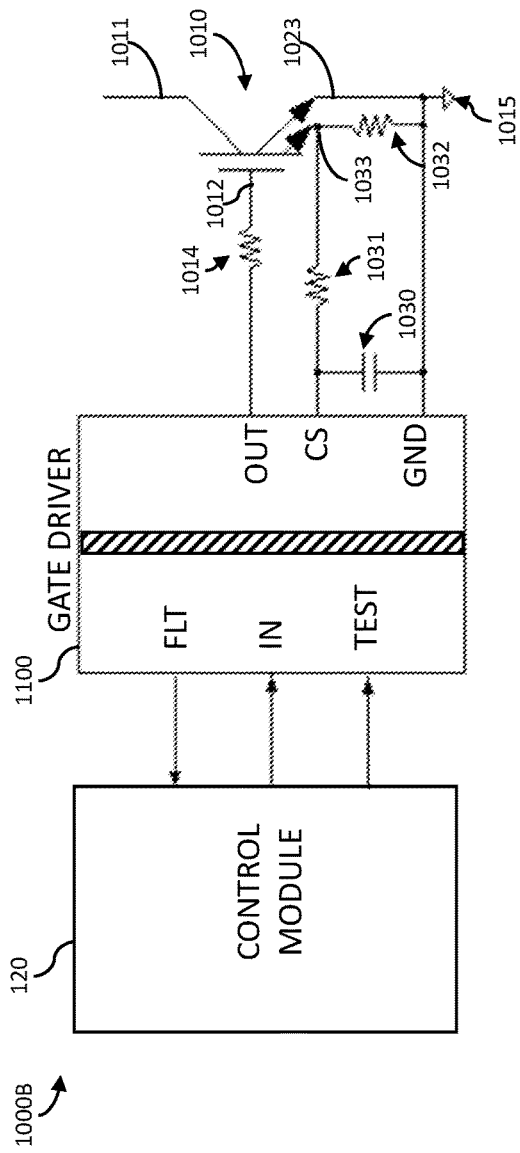
FIG. 10B illustrates a power system according to a third possible implementation of the present disclosure.

FIG. 10B illustrates a power system according to a third possible implementation of the present disclosure. The power system 1000B is substantially the same as the implementation shown in FIG. 10A with the exception of the power transistor 1010. As shown, the power transistor 1010 may be implemented as a four terminal IGBT including a collector terminal 1011, a gate terminal 1012, a first emitter terminal 1023 (i.e., power emitter), and a second emitter terminal 1033 (i.e., Kelvin emitter). In one possible implementation, the first emitter terminal 1023 is coupled directly to ground 1015 while the second emitter terminal 1033 is coupled to the same ground 1015 through the current-sense resistor 1032. In another possible implementation, the first emitter terminal 1023 is coupled directly to a first ground (i.e., power ground) and the second emitter terminal 1033 is coupled to a second ground (i.e., signal ground) through the current-sense resistor 1032. In either case the voltage at the second emitter terminal 1033 is filtered by the current sense filter, including the filter resistor 1031 and the filter capacitor 1030, before being transmitted to the current sense terminal (CS) of the gate driver 1100.

Figure 11:
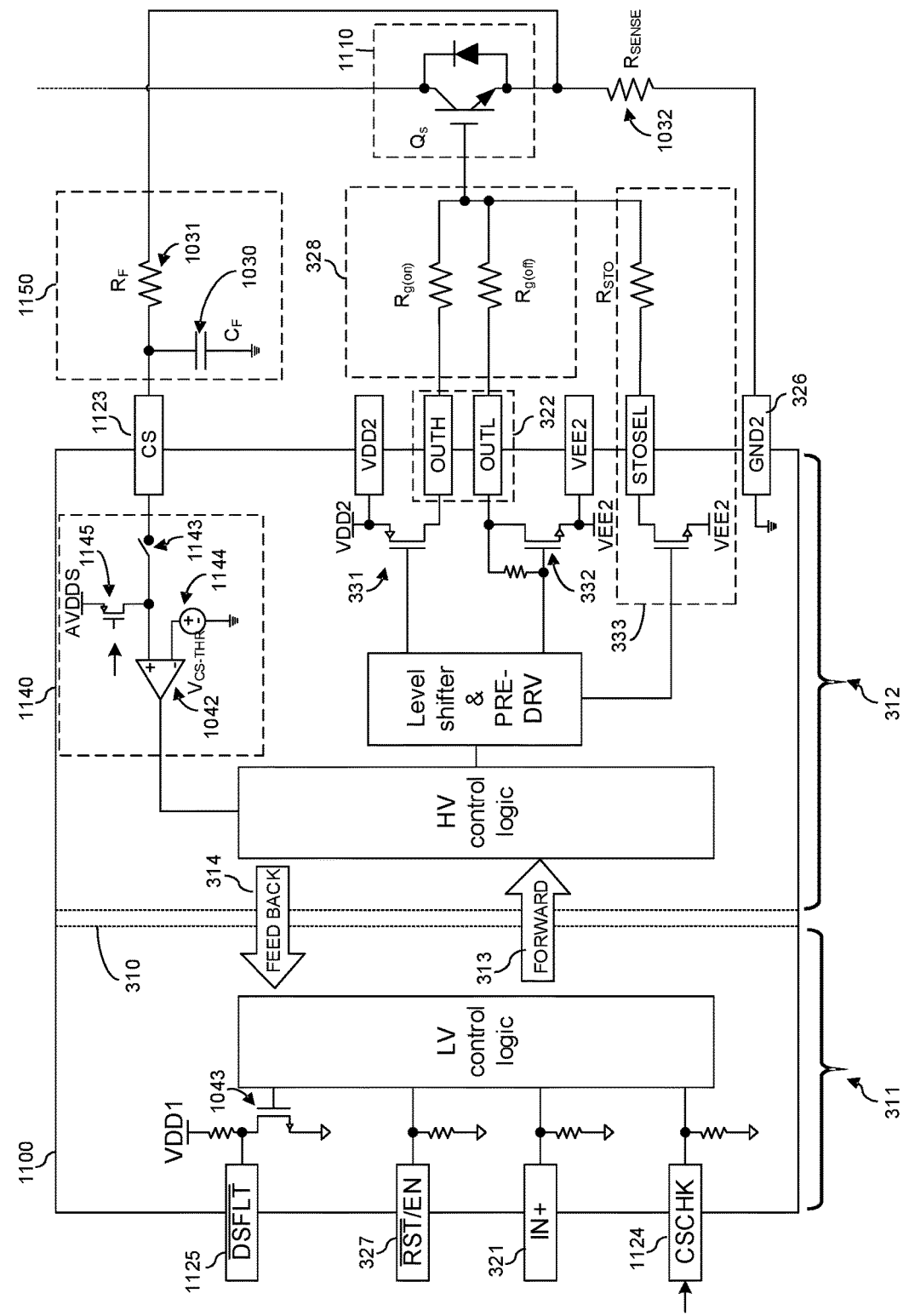
FIG. 11 is a block diagram that schematically illustrates a gate driver configured for current sensing according to a possible implementation of the present disclosure.

FIG. 11 is a block diagram that schematically illustrates a gate driver configured for current sensing according to a possible implementation of the present disclosure. As discussed previously, the gate driver 1100 includes a low-voltage side 311 and a high-voltage side 312 isolated (e.g., galvanic isolation) by an isolation barrier 310. Signals can be communicated across the isolation barrier 310 from the low-voltage side 311 to the high-voltage side 312 using a forward communication channel 313. Signals can be communicated across the isolation barrier 310 from the high-voltage side 312 to the low-voltage side 311 using a feedback communication channel 314.

The gate driver 1100 may be configured to receive input (e.g., from the control module) on the low-voltage side 311 at an input terminal 321 (i.e., IN+), a CS-test terminal 1124 (i.e., CSCHK) and transmit a fault signal (e.g., to the control module) at a CS-fault terminal 1125 (i.e., /CSFLT). Additionally, a reset signal or enable signal may be received at a reset terminal 327 (i.e., /RST/EN). For example, a reset signal can be transmitted to the reset terminal 327 in order to clear (i.e., change states of) a fault signal at the CS-fault terminal 1125.

The gate driver 1100 includes a driver circuit to generate signals to control the power transistor 1110 to an ON/OFF condition. The driver circuit can include an output terminal 322 that includes a high output (i.e., OUTH) and a low output (i.e., OUTL) coupled to a gate resistor network 328. The driver circuit may further include a high-side transistor 331 and a low-side transistor 332. The driver circuit can be controlled by an input signal at the input terminal 321 communicated over the forward communication channel 313. The high-side transistor 331, the low-side transistor 332, and the gate resistor network 328 may be considered part of an output stage (i.e., OUT STAGE) of the driver circuit.

To turn ON the power transistor 1110, the high-side transistor 331 may be configured in an ON condition to couple an upper high-voltage rail (VDD2) to the gate terminal of the power transistor 110 via a first gate resistor (Rg(on)) of a gate resistor network 328 while a low-side transistor 332 is in an OFF condition. To turn OFF the power transistor 1110, the low-side transistor 332 may be configured in an ON condition to couple a lower high-voltage rail (VEE2) to the gate terminal of the power transistor 1110 via a second gate resistor (Rg(off)) of a gate resistor network 328, while a high-side transistor 331 is in an OFF condition. In a possible implementation, the driver further includes a shutdown circuit 333 configured to turn the power transistor 1110 OFF if a fault is detected.

The gate driver 1100 includes a current-sense fault detection circuit 1140, that when enabled, is configured to receive a voltage from the current-sense filter 1150 coupled at the current sense terminal 1123 (CS) of the gate driver. As discussed, a current-sense resistor 1032 ($R_{SENSE}$) is configured to sense the current condition of the power transistor 1110 as a voltage. This voltage can charge the filter capacitor 1030 of the current-sense filter 1150 so the voltage received by the current-sense fault detection circuit 1140 is the voltage of the filter capacitor 1030 ($C_F$) while the power transistor 1110 is ON.

The current-sense fault detection circuit 1140 includes a comparator 1042. The comparator 1042 is configured to compare a voltage at a first input to a current-sense fault detection voltage (i.e., threshold voltage 1144) and output a CS fault when the voltage is greater than or equal to the threshold. The first input of the comparator 1042 is coupled to the current sense terminal 1123 by a current sense switch 1143 (i.e., CS SW). The current sense switch 1143 can be turned ON (i.e., closed) when the power transistor 1110 is ON so that the voltage at the current sense terminal 1123 is the voltage of the filter capacitor 1030. The current sense switch may be OFF while the power transistor 1110 is OFF during a test of the current-sense fault detection circuit 1140.

The current-sense fault detection circuit 1140 includes a CS test switch 1145 coupled between a test voltage and the first input of the comparator 1042. During a test of the current-sense fault detection circuit 1140, the current sense switch 1143 may be turned OFF (opened) to decouple the current sense terminal 1123 from the first input of the comparator 1042. Additionally, the CS test switch 1145 may be turned ON to couple the test voltage to the first input of the comparator 1042. The test voltage coupled to the first input of the comparator may be greater than the threshold voltage 1144 so that the comparator generates a CS-fault. This CS-fault may be communicated over the feedback communication channel 314 to a transistor 1043 at the CS-fault terminal 1125 in order to transition the /CSFLT signal at the CS-fault terminal 1125, thereby indicating a CS-fault. If no CS-fault appears at the CS-fault terminal 1125, then it may be concluded that there is a fault in the comparator 1042 or the transistor 1043.

Figure 12:
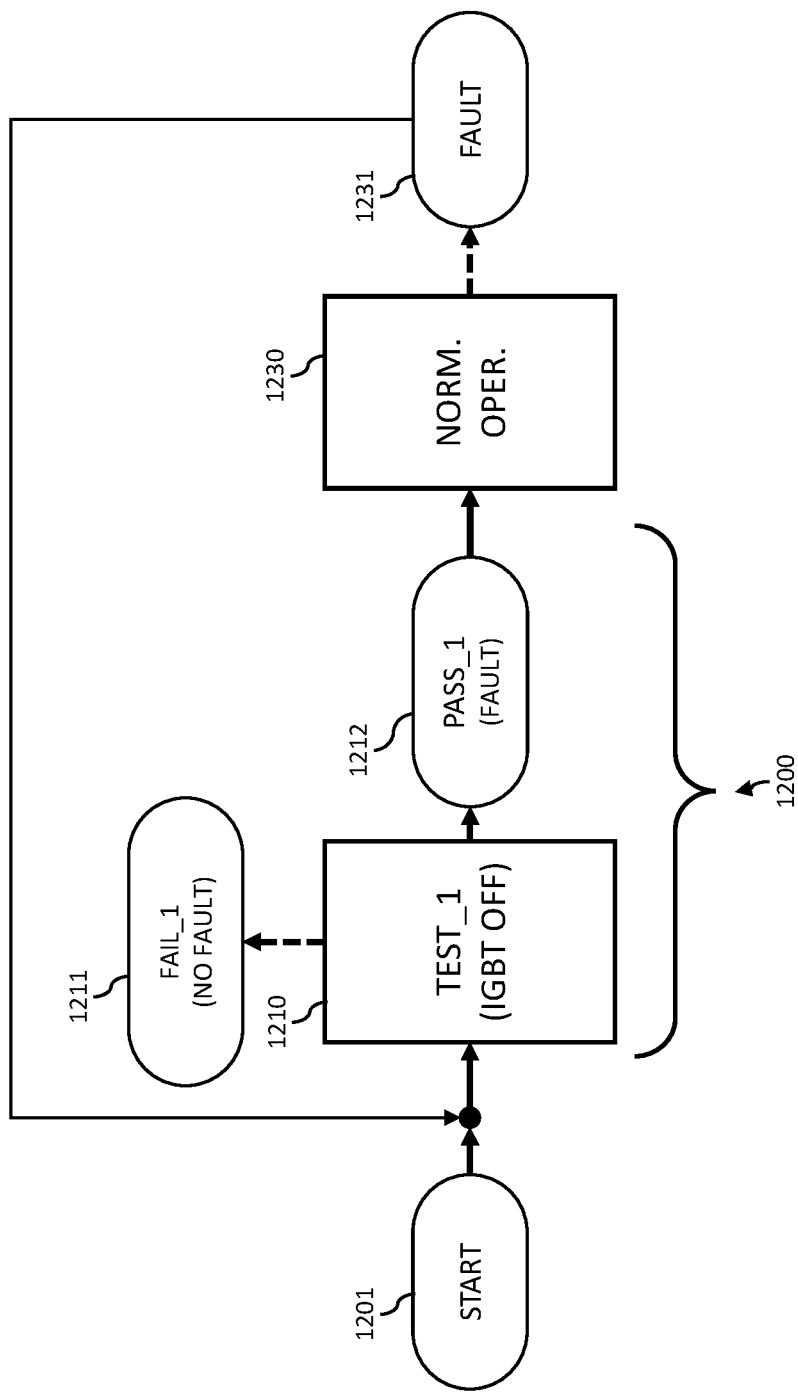
FIG. 12 is a flow chart illustrating current-sense fault-detection testing for the power system of FIG. 11.

FIG. 12 is a flow chart illustrating current-sense fault-detection testing for the power system of FIG. 11. The testing includes a one-test protocol 1200 including a first test 1210 (i.e., TEST_1) to test the fault detection capability (i.e., action) of the current-sense fault detection circuit 1140. The one-test protocol 1200 may be executed (i) after startup 1201 or (ii) after a fault 1231 is detected during normal operation 1230.

The first test 1210 includes placing the power transistor 1110 in the OFF condition (i.e., turning the power transistor OFF) and coupling a test voltage to an input of the comparator 1042 that exceeds the threshold voltage 1144. The reference voltage can be a fixed voltage that corresponds to an over-current condition of the power transistor 1110. The test voltage coupled to the input of the comparator simulates the over-current condition. It is not an actual over-current condition because the power transistor 1110 is in the OFF condition during the test. A control module is configured to monitor a CS-fault terminal 1125 (i.e., /CSFLT) during a first period corresponding to the first test 1210 for a fault signal. When the gate driver is operating correctly, a fault signal will be received.

The first test 1210 fails when no fault signal is received by the control module 120 during the first period. In the first-test failed state 1211 (i.e., FAIL_1), some conclusions may be made about the operation of the gate driver 1100. For example, not receiving the fault signal could indicate that (i) the comparator 1042 did not output a fault signal in response to the test or (ii) the transistor 1043 did not respond to the fault signal.

The first test 1210 passes when a fault signal is received by the control module 120 during the first period. In the first-test passed state 1212 (i.e., PASS_1), some conclusions may be made about the operation of the power system 100. For example, the fault signal indicates that the comparator 1042 and the transistor 1043 are operating as expected.

FIG. 13 is a flow chart of a method for testing a power system according to a second possible implementation of the present disclosure. The method 1300 includes a first test 1301. The first test 1301 includes receiving 1311 a test signal at a test terminal of the gate driver. The first test further includes configuring 1312 a power transistor, coupled to the gate driver, in an OFF condition. The first test 1301 further includes decoupling 1313 the CS terminal of the gate driver from the comparator of the current-sense fault detection circuit. The first test 1301 further includes coupling 1314 a test voltage to the comparator. The first test 1301 further includes comparing 1315 the test voltage to a threshold using the comparator. A fault terminal of the gate driver can be monitored for a fault. If a fault is output 1316, then the first test passes (PASS_1), otherwise no fault is generated, and the first test fails (FAIL_1).

In a possible implementation, the first test 1301 may further include determining likely sources of the failure. For example, if the test voltage exceeded the threshold during the first test but no fault was generated, then the first test may have failed due to a faulty comparator or a faulty transistor at the fault terminal.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A power system comprising:
   a power transistor that is configurable in an ON condition or an OFF condition corresponding to a signal at a gate of the power transistor;
   a desaturation sense circuit coupled to a terminal of the power transistor and including a blanking capacitor configured to be charged to a voltage corresponding to a desaturation condition of the power transistor;
   a gate driver including:
      a driver circuit configured to generate the signal at the gate of the power transistor according to an input signal at an input terminal of the gate driver; and
      a desaturation fault detection circuit that is configured to receive the voltage of the blanking capacitor and generate a fault signal when the voltage of the blanking capacitor exceeds a threshold; and
   a control module configured to:
      perform a first test of the power system, the first test including:
         transmitting a first test signal to a test terminal of the gate driver to configure the power transistor in the OFF condition and to configure the desaturation fault detection circuit to receive the voltage of the blanking capacitor, the voltage of the blanking capacitor charged by the desaturation fault detection circuit during the first test;
      determine that the first test has passed or failed; and
      perform a second test of the power system after the first test has passed, the second test including:
         transmitting a second test signal to the input terminal of the gate driver to configure the power transistor in the ON condition, the voltage of the blanking capacitor being charged by the power transistor in the ON condition.

2. The power system according to claim 1, wherein the first test further includes:
   not receiving the fault signal in response to the first test signal;
   failing the first test; and
   determining from the first test that failed:
      the desaturation fault detection circuit did not generate the fault signal;
      the blanking capacitor was not charged; or
      the power transistor was short circuited.

3. The power system according to claim 1, wherein the first test further includes:
   receiving the fault signal in response to the first test signal;
   passing the first test; and
   determining from the first test that passed:
      the desaturation fault detection circuit and the blanking capacitor are operating properly to detect the desaturation condition of the power transistor; and
      the power transistor is not short circuited.

4. The power system according to claim 1, wherein the gate driver further includes:
   an isolation barrier between a low-voltage side and a high-voltage side, and
   a multiplexer configured to communicate the second test signal at the input terminal of the gate driver and the first test signal at the test terminal of the gate driver across the isolation barrier over a shared communication channel.

5. The power system according to claim 1, wherein the fault signal is a first fault signal, and the second test further includes:
   receiving a second fault signal in response to the second test signal;
   failing the second test; and
   determining from the second test that failed:
      the gate of the power transistor did not receive the signal from the driver circuit to configure the power transistor in the ON condition;
      the blanking capacitor was not charged by the power transistor in the ON condition; or
      the power transistor was open circuited.

6. The power system according to claim 1, wherein the second test further includes:
   receiving no fault signal in response to the second test signal;
   passing the second test; and
   determining from the second test that passed:
      the driver circuit is operating properly to transmit the signal to the gate of the power transistor to configure the power transistor in the ON condition;
      the desaturation sense circuit is operating properly to charge the power transistor according to a desaturation voltage at the terminal of the power transistor; and
      the power transistor is not open circuited.

7. The power system according to claim 1, wherein the power transistor is an insulated gate bipolar transistor (IGBT) coupled at the gate to the driver circuit, coupled at a collector to the desaturation sense circuit, and coupled at an emitter to a ground.

8. The power system according to claim 7, wherein the desaturation sense circuit includes:
a resistor coupled to a desaturation terminal of the gate driver; and
a diode coupled between the resistor and the collector of the insulated gate bipolar transistor, wherein an anode of the diode is coupled to the resistor and a cathode of the diode is coupled to the collector of the insulated gate bipolar transistor, wherein the blanking capacitor is coupled between the desaturation terminal and the ground so that the voltage of the blanking capacitor corresponds to a collector-emitter voltage of the IGBT when the IGBT is in the ON condition.

9. The power system according to claim 8, wherein the desaturation fault detection circuit includes:
a current source coupled between a power source and the desaturation terminal of the gate driver;
a desaturation switch coupled between the desaturation terminal and the ground, the desaturation switch configurable to clear the voltage of the blanking capacitor; and
a comparator coupled at a first terminal to the desaturation terminal of the gate driver to receive the voltage of the blanking capacitor and coupled at a second terminal to a threshold voltage corresponding to the threshold.

10. A method for testing a power system comprising:
receiving a first test signal at a test terminal of a gate driver to begin a first test;
configuring, during the first test, a power transistor in an OFF condition;
charging, by a desaturation fault detection circuit of the gate driver, a voltage of a blanking capacitor, the blanking capacitor coupled externally to the gate driver at a desaturation terminal of the gate driver;
comparing, by the desaturation fault detection circuit, the voltage of the blanking capacitor to a threshold to generate a fault signal;
determining that the first test has passed or failed based on the fault signal; and
performing a second test based on the first test being passed, the second test including:
configuring, during the second test, the power transistor in an ON condition.

11. The method according to claim 10, further comprising:
not receiving the fault signal at a fault terminal of the gate driver in response to the first test signal at the test terminal;
failing the first test; and
determining from the first test that failed:
the desaturation fault detection circuit did not generate the fault signal;
the blanking capacitor was not charged; or
the power transistor was short circuited.

12. The method according to claim 10, further comprising:
receiving the fault signal at a fault terminal of the gate driver in response to the first test signal at the test terminal;
passing the first test; and
determining from the first test that passed:
the desaturation fault detection circuit and the blanking capacitor are operating properly to detect a desaturation condition of the power transistor; and
the power transistor is not short circuited.

13. The method according to claim 10, wherein the fault signal is a first fault signal; the method further including:
configuring the desaturation fault detection circuit of the gate driver to receive the voltage of the blanking capacitor, the voltage of the blanking capacitor charged by the power transistor in the ON condition;
comparing, by the desaturation fault detection circuit, the voltage of the blanking capacitor to the threshold; and
transmitting, by the desaturation fault detection circuit, a second fault signal to a fault terminal of the gate driver when the voltage of the blanking capacitor exceeds the threshold.

14. The method according to claim 10, wherein the gate driver further includes an isolation barrier between a low-voltage side and a high-voltage side of the gate driver, the method further including:
communicating the first test signal at the test terminal of the gate driver across the isolation barrier over a shared communication channel.

15. The method according to claim 10 wherein performing the second test based on the first test being passed further includes:
not receiving a second fault signal at a fault terminal of the gate driver in response to a second test signal at an input terminal of the gate driver;
passing the second test; and
determining from the second test that passed:
a driver circuit of the gate driver is operating properly to transmit an ON signal to a gate of the power transistor to configure the power transistor in the ON condition;
a desaturation sense circuit is operating properly to couple the blanking capacitor to a collector of the power transistor; and
the power transistor is not open circuited.

16. The method according to claim 10 wherein performing the second test based on the first test being passed further includes:
receiving a second fault signal at a fault terminal of the gate driver in response to a second test signal at an input terminal of the gate driver;
failing the second test; and
determining from the second test that failed:
a gate of the power transistor did not receive an ON signal from a driver circuit of the gate driver to configure the power transistor in the ON condition;
the blanking capacitor was not coupled to a collector of the power transistor; or
the power transistor was open circuited.

17. The method according to claim 10, wherein the power transistor is an insulated gate bipolar transistor (IGBT) coupled at a gate to a driver circuit of the gate driver, coupled at a collector to a desaturation sense circuit of the gate driver, and coupled at an emitter to a ground.

18. A gate driver comprising:
a driver circuit configured to:
drive a power transistor coupled to the gate driver in an OFF condition in response to a first test signal; and
drive the power transistor coupled to the gate driver in an ON condition in response to a second test signal; and
a desaturation fault detection circuit configured to:
charge, in response to the first test signal, a blanking capacitor coupled to a desaturation terminal of the gate driver;
detect, during a first test period, that a voltage of the blanking capacitor satisfies a fault condition to determine that the blanking capacitor is operating properly;

not charge, in response to the second test signal, the blanking capacitor; and detect, during a second test period, that the voltage of the blanking capacitor does not satisfy the fault condition to determine that the power transistor is operating properly.

19. The gate driver according to claim 18, wherein the gate driver further includes:

an isolation barrier between a low-voltage side and a high-voltage side; and a multiplexer configured to communicate the first test signal, which is received at a test terminal of the gate driver, and the second test signal, which is received at an input terminal of the gate driver, across the isolation barrier over a shared communication channel.

* * * * *